United States Patent
Zeng et al.

(10) Patent No.: US 10,261,427 B2
(45) Date of Patent: Apr. 16, 2019

(54) METROLOGY METHOD AND APPARATUS, COMPUTER PROGRAM AND LITHOGRAPHIC SYSTEM

(71) Applicant: ASML Netherlands B.V., Veldhoven (NL)

(72) Inventors: Si-Han Zeng, New Taipei (TW); Yue-Lin Peng, Taoyuan (TW); Jen-Yu Fang, Taichung (TW); Arie Jeffrey Den Boef, Waalre (NL); Alexander Straaijer, Eindhoven (NL); Ching-Yi Hung, Taipei (TW); Patrick Warnaar, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/869,661

(22) Filed: Jan. 12, 2018

(65) Prior Publication Data

US 2018/0136570 A1    May 17, 2018

Related U.S. Application Data

(63) Continuation of application No. 15/133,866, filed on Apr. 20, 2016, now Pat. No. 9,869,940.

(30) Foreign Application Priority Data

Apr. 21, 2015 (EP) ..................................... 15164537
Sep. 30, 2015 (EP) ..................................... 15187706
Apr. 14, 2016 (EP) ..................................... 16165356

(51) Int. Cl.
*G03F 7/20* (2006.01)
*G01B 11/24* (2006.01)
*G01B 11/27* (2006.01)

(52) U.S. Cl.
CPC .......... *G03F 7/70633* (2013.01); *G01B 11/24* (2013.01); *G01B 11/272* (2013.01)

(58) Field of Classification Search
CPC .... G01B 11/24; G01B 11/272; G03F 7/70633
(Continued)

(56) References Cited

U.S. PATENT DOCUMENTS 7,619,737 B2   11/2009   Mos et al.
7,656,518 B2   2/2010    Den Boef et al.
(Continued)

FOREIGN PATENT DOCUMENTS

JP   2004-158478 A   6/2004
JP   2006-060214 A   3/2006
(Continued)

OTHER PUBLICATIONS

International Search Report and Written Opinion of the International Searching Authority directed to related International Patent Application No. PCT/EP2016/058582, dated Aug. 4, 2016; 12 pages.
(Continued)

*Primary Examiner* — Tri T Ton
(74) *Attorney, Agent, or Firm* — Sterne, Kessler, Goldstein & Fox P.L.L.C.

(57) ABSTRACT

Disclosed are a method, computer program and associated apparatuses for measuring a parameter of a lithographic process. The method comprising the steps of: obtaining first measurements comprising measurements of structural asymmetry relating to a plurality of first structures, each of said plurality of measurements of structural asymmetry corresponding to a different measurement combination of measurement radiation and a value for at least a first parameter; obtaining a plurality of second measurements of target asymmetry relating to a plurality of targets, each of said
(Continued)

plurality of measurements of target asymmetry corresponding to one of said different measurement combinations, determining a relationship function describing the relationship between said first measurements and said second measurements, for each of said measurement combinations; determining, from said relationship function, a corrected overlay value, said corrected overlay value being corrected for structural contribution due to structural asymmetry in at least said first structure.

8 Claims, 8 Drawing Sheets

(58) Field of Classification Search
USPC .................................................. 356/600–640
See application file for complete search history.

(56) References Cited

U.S. PATENT DOCUMENTS

| | | |
|---|---|---|
| 7,791,727 B2 | 9/2010 | Den Boef et al. |
| 8,111,398 B2 | 2/2012 | Van der Schaar et al. |
| 8,749,786 B2 | 6/2014 | Fuchs et al. |
| 8,797,554 B2 | 8/2014 | Straaijer |
| 9,069,264 B2 | 6/2015 | Warnaar et al. |
| 9,869,940 B2 | 1/2018 | Zeng et al. |
| 9,946,167 B2 | 4/2018 | Smilde et al. |
| 2004/0147121 A1 | 7/2004 | Nakagaki et al. |
| 2010/0321654 A1 | 12/2010 | Den Boef |
| 2011/0027704 A1 | 2/2011 | Cramer et al. |
| 2011/0043791 A1 | 2/2011 | Smilde et al. |
| 2011/0204484 A1 | 8/2011 | Van Der Schaar et al. |
| 2012/0013881 A1 | 1/2012 | Den Boef et al. |
| 2012/0242940 A1 | 9/2012 | Nagata et al. |
| 2013/0054186 A1 | 2/2013 | Den Boef |
| 2013/0308142 A1 | 11/2013 | Straaijer |
| 2015/0138523 A1 | 5/2015 | Jak et al. |
| 2015/0145151 A1 | 5/2015 | Van der Schaar et al. |
| 2016/0313654 A1 | 10/2016 | Zeng et al. |

FOREIGN PATENT DOCUMENTS

| | | |
|---|---|---|
| JP | 4971225 B2 | 7/2012 |
| JP | 2014-502420 A | 1/2014 |
| JP | 2014-529896 A | 11/2014 |
| WO | WO 2009/078708 | 6/2009 |
| WO | WO 2009/106279 | 9/2009 |
| WO | WO 2011/012624 | 2/2011 |
| WO | WO 2013/143814 | 10/2013 |
| WO | WO 2014/005828 | 1/2014 |
| WO | WO 2015/018625 | 2/2015 |
| WO | WO 2015/078669 | 6/2015 |

OTHER PUBLICATIONS

International Preliminary Report on Patentability directed to related International Patent Application No. PCT/EP2016/058582, dated Oct. 24, 2017; 7 pages.

Notification of Reasons for Refusal with English-language Translation attached from related Japanese Patent Publication No. JP 2018-517920 A, dated Dec. 18, 2018; 6 pages.

Japanese Notice of Reasons for Rejection with English-language translation attached directed to related Japanese Patent Application No. JP 2017-553413, dated Dec. 18, 2018; 5 pages.

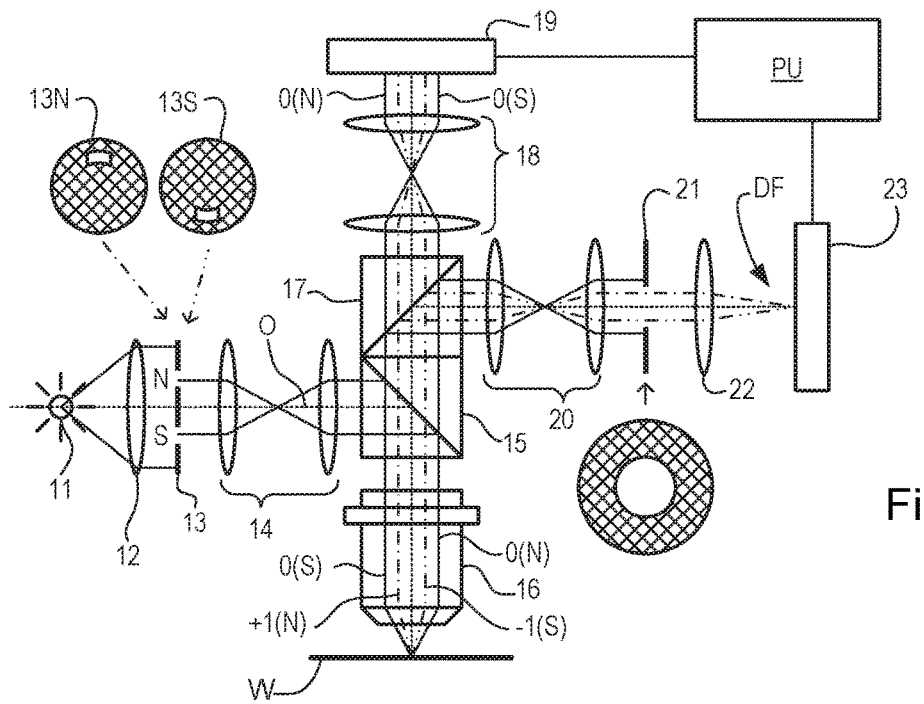
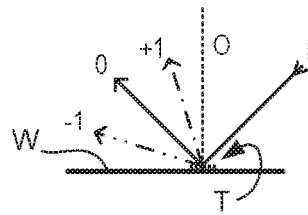
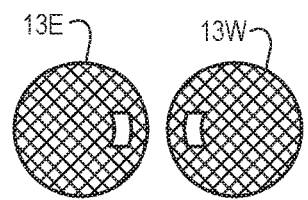
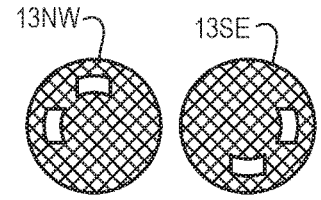
Fig. 3(b)   Fig. 3(c)   Fig. 3(d)
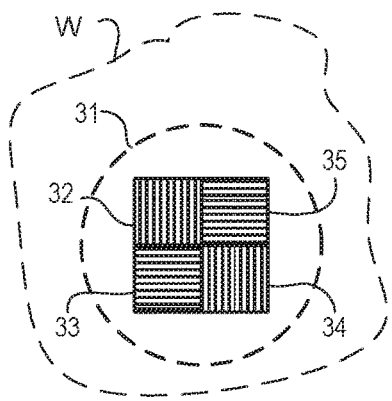
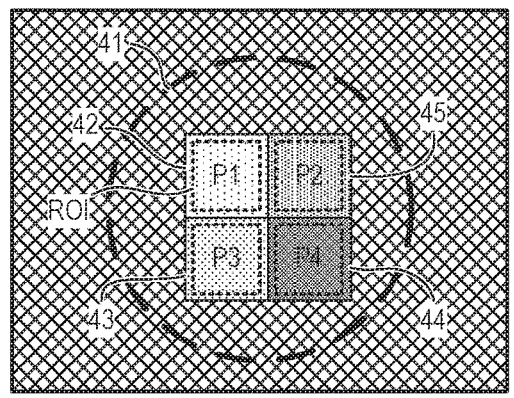
Fig. 4   Fig. 5

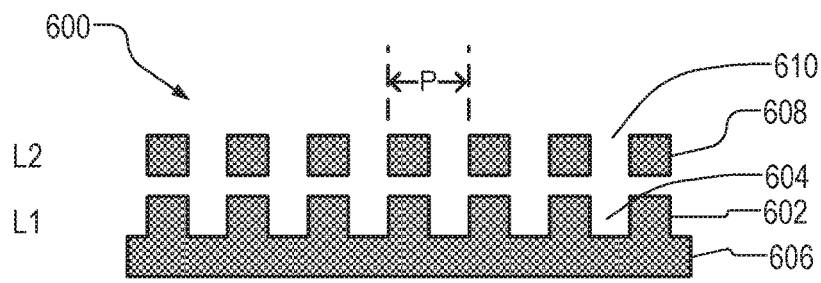
Fig. 7(a)
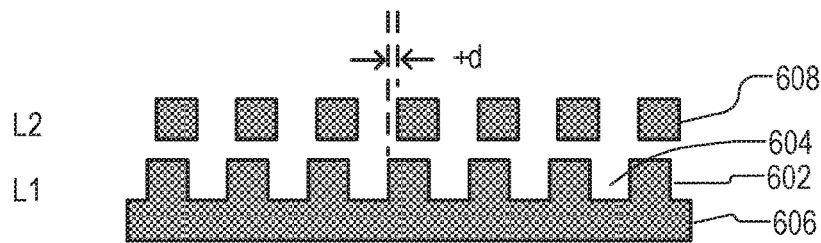
Fig. 7(b)
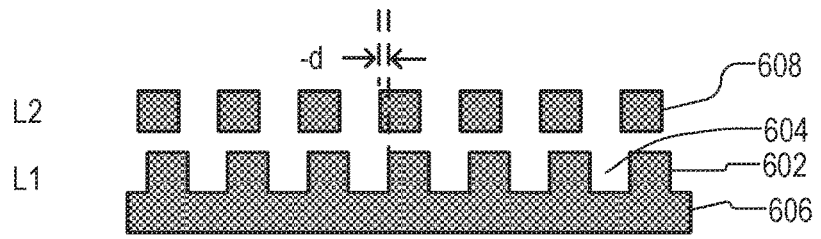
Fig. 7(c)
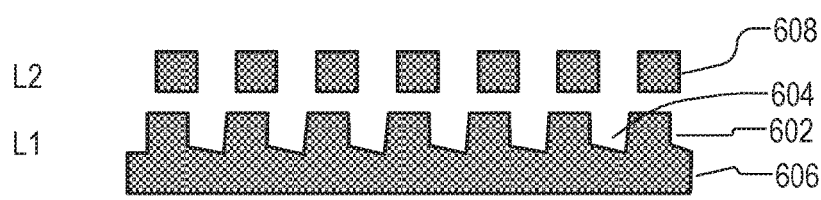
Fig. 7(d)
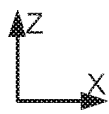

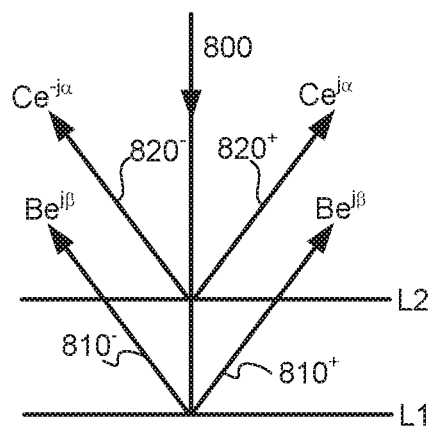 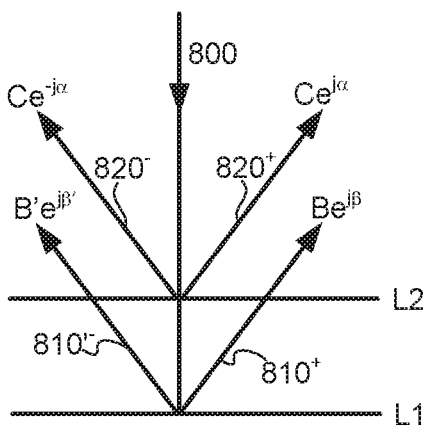
Fig. 10(a)    Fig. 10(b)
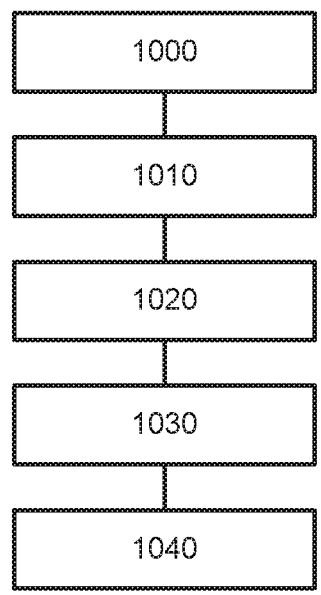
Fig. 12

METROLOGY METHOD AND APPARATUS, COMPUTER PROGRAM AND LITHOGRAPHIC SYSTEM

CROSS REFERENCE TO RELATED APPLICATIONS

This application claims benefit to U.S. application Ser. No. 15/133,866 and EP Applications 15164537.1, 15187706.5 and 16165356.3, which are incorporated by reference herein in its entirety.

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

The targets used by conventional scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120242940A. The contents of all these applications are also incorporated herein by reference. Diffraction-based overlay using dark-field detection of the diffraction orders enables overlay measurements on smaller targets. These targets can be smaller than the illumination spot and may be surrounded by product structures on a wafer. Targets can comprise multiple gratings which can be measured in one image.

In the known metrology technique, overlay measurement results are obtained by measuring the target twice under certain conditions, while either rotating the target or changing the illumination mode or imaging mode to obtain separately the −1st and the +1st diffraction order intensities. The intensity asymmetry, a comparison of these diffraction order intensities, for a given target provides a measurement of target asymmetry, that is asymmetry in the target. This asymmetry in the target can be used as an indicator of overlay error (undesired misalignment of two layers).

Although the known dark-field image-based overlay measurements are fast and computationally very simple (once calibrated), they rely on an assumption that overlay (i.e., overlay error and deliberate bias) is the only cause of target asymmetry in the target. Any other asymmetry in the target, such as structural asymmetry of features within one or both of the overlaid gratings, also causes an intensity asymmetry in the 1st (or other higher) orders. This intensity asymmetry attributable to structural asymmetry, and which is not related to overlay, clearly perturbs the overlay measurement, giving an inaccurate overlay measurement. Asymmetry in the lowermost or bottom grating of a target is a common form of structural asymmetry. It may originate for example in wafer processing steps such as chemical-mechanical polishing (CMP), performed after the bottom grating was originally formed.

Therefore, it is desired to distinguish the contributions to target asymmetry that are caused by overlay error and other effects in a more direct and accurate way. It is also desirable to identify preferred target designs, either separately or on combination with different measurement recipes.

SUMMARY OF THE INVENTION

The invention in a first aspect provides a method of measuring a parameter of a lithographic process, the method comprising the steps of:

obtaining a plurality of first measurements, said first measurements comprising measurements of structural asymmetry relating to a plurality of first structures, said plurality of first measurements comprising measurements corresponding to different measurement combinations, differing in terms of at least one measurement radiation;

obtaining a plurality of second measurements, said second measurements comprising measurements of target asymmetry relating to a plurality of targets, each of said plurality of second measurements corresponding to one of said plurality of first measurements in terms of the measurement combination, each of said targets comprising one of said first structures and a second structure overlaid thereon, said target asymmetry comprising an overlay contribution which is independent of structural asymmetry, and a structural contribution due to structural asymmetry in at least said first structure;

determining a relationship function describing the relationship between said first measurements and said second measurements, for each of said measurement combinations;

determining, from said relationship function, a corrected overlay value, said corrected overlay value being corrected for said structural contribution due to structural asymmetry in at least said first structure.

The invention in a second aspect provides a method of selecting a target from a plurality of candidate targets said method comprising:

obtaining plural sets of measurements for a plurality of candidate measurement radiation combinations and a plurality of candidate targets, each candidate target comprising a first structure overlaid with a second structure, each set of measurements relating to a different combination of one of said candidate targets and one of said candidate measurement radiation combinations; each set of measurements comprising, for multiple samples of the candidate target:

plural first measurements comprising measurements of structural asymmetry in the first structure of the candidate target using, respectively, each measurement radiation of said candidate measurement radiation combination;

plural second measurements comprising measurements of target asymmetry in the candidate target using, respectively, each measurement radiation of said candidate measurement radiation combination;

for each set of measurements, determining a degree of correlation between said first measurements and said second measurements;

selecting a preferred target from one of said candidate targets based upon the determined degree of correlation for each set of measurements.

The invention in a third aspect provides a metrology apparatus operable to perform the method of the first aspect or the second aspect. The invention in a fourth aspect provides a lithographic system comprising a metrology apparatus of the third aspect.

The invention further provides a computer program comprising processor readable instructions which, when run on suitable processor controlled apparatus, cause the processor controlled apparatus to perform the method of the first aspect or the second aspect, and a computer program carrier comprising such a computer program. The processor controlled apparatus may comprise the metrology apparatus of the third aspect or the lithographic system of the fourth aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which:

FIGS. 3(a)-3(d) comprise (a) a schematic diagram of a dark field scatterometer for use in measuring targets according to embodiments of the invention using a first pair of illumination apertures, (b) a detail of diffraction spectrum of a target grating for a given direction of illumination (c) a second pair of illumination apertures providing further illumination modes in using the scatterometer for diffraction based overlay measurements and (d) a third pair of illumination apertures combining the first and second pair of apertures;

FIG. 4 depicts a known form of multiple grating target and an outline of a measurement spot on a substrate;

FIG. 5 depicts an image of the target of FIG. 4 obtained in the scatterometer of FIG. 3;

FIGS. 7(a) to 7(c) show schematic cross-sections of overlay gratings having different overlay values in the region of zero;

FIG. 7 (d) is a schematic cross-section of an overlay grating having structural asymmetry in a bottom grating due to processing effects;

FIGS. 10(a)-10(b) illustrate diffraction signals following refraction by a target comprising first and second overlaid structures, (a) with no structural asymmetry in the first layer and (b) with structural asymmetry in the first layer;

FIG. 12 is a flowchart of the steps of a method according to a first exemplary embodiment of the invention;

DETAILED DESCRIPTION OF EXEMPLARY EMBODIMENTS

Before describing embodiments of the invention in detail, it is instructive to present an example environment in which embodiments of the present invention may be implemented.

Figure 1:
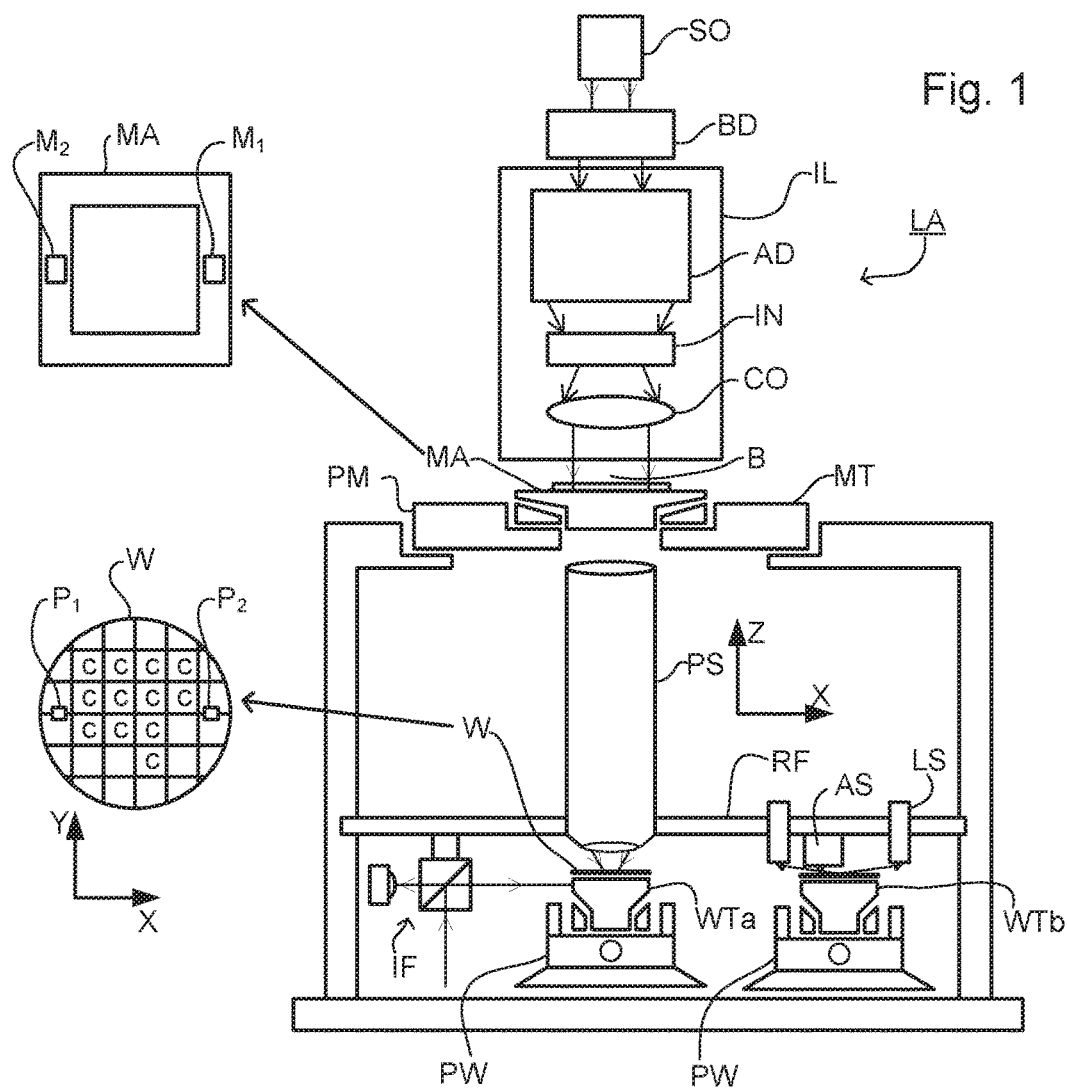
FIG. 1 depicts a lithographic apparatus according to an embodiment of the invention.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
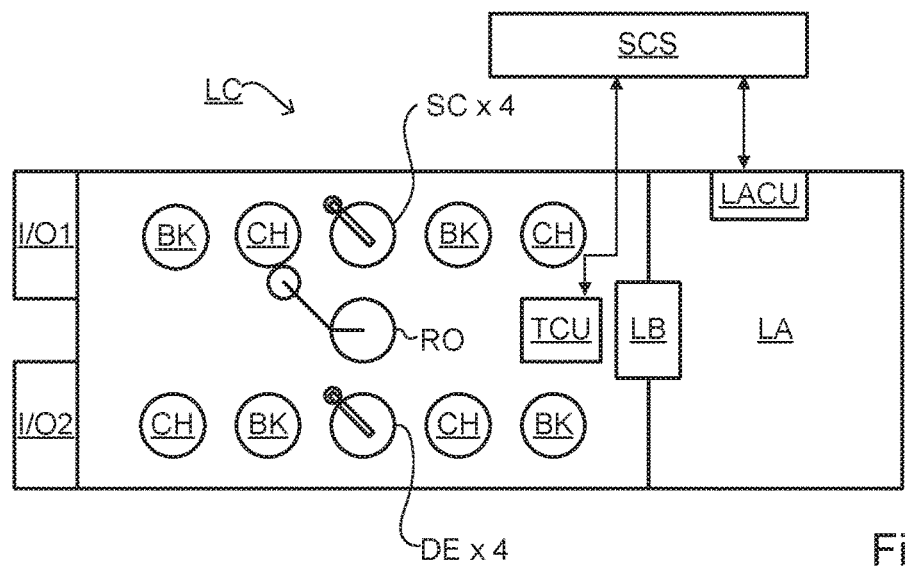
FIG. 2 depicts a lithographic cell or cluster according to an embodiment of the invention.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

A metrology apparatus suitable for use in embodiments of the invention is shown in FIG. 3(a). A target T and diffracted rays of measurement radiation used to illuminate the target are illustrated in more detail in FIG. 3(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4 F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 3) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(c) and (d). The use of these, and numerous other variations and applications of the apparatus are described in prior published applications, mentioned above.

FIG. 4 depicts a (composite) target formed on a substrate according to known practice. The target in this example comprises four gratings 32 to 35 positioned closely together so that they will all be within a measurement spot 31 formed by the metrology radiation illumination beam of the metrology apparatus. The four gratings thus are all simultaneously illuminated and simultaneously imaged on sensors 19 and 23. In an example dedicated to measurement of overlay, gratings 32 to 35 are themselves composite gratings formed by overlying gratings that are patterned in different layers of the semiconductor device formed on substrate W. Gratings 32 to 35 may have differently biased overlay offsets in order to facilitate measurement of overlay between the layers in which the different parts of the composite gratings are formed. The meaning of overlay bias will be explained below with reference to FIG. 7. Gratings 32 to 35 may also differ in their orientation, as shown, so as to diffract incoming radiation in X and Y directions. In one example, gratings 32 and 34 are X-direction gratings with biases of the +d, −d, respectively. Gratings 33 and 35 are Y-direction gratings with offsets +d and −d respectively. Separate images of these gratings can be identified in the image captured by sensor 23. This is only one example of a target. A target may comprise more or fewer than 4 gratings, or only a single grating.

FIG. 5 shows an example of an image that may be formed on and detected by the sensor 23, using the target of FIG. 4 in the apparatus of FIG. 3, using the aperture plates 13NW or 13SE from FIG. 3(d). While the pupil plane image sensor 19 cannot resolve the different individual gratings 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the targets are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Figure 6:
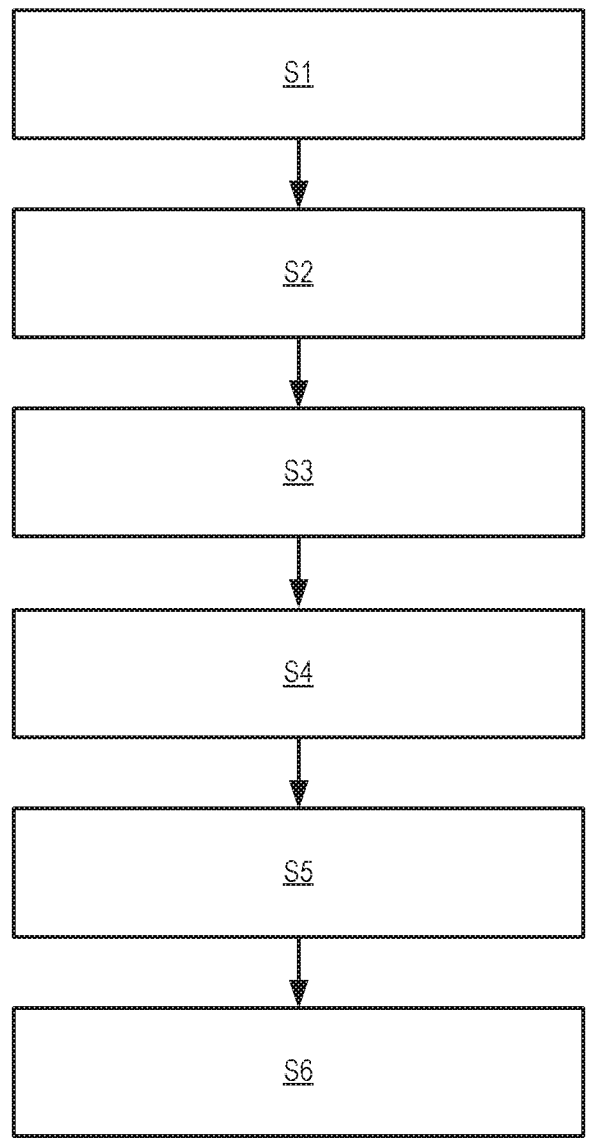
FIG. 6 is a flowchart showing the steps of an overlay measurement method using the scatterometer of FIG. 3 and adaptable to form embodiments of the present invention.

FIG. 6 illustrates how, using for example the method described in application WO 2011/012624, overlay error (i.e., undesired and unintentional overlay misalignment) between the two layers containing the component gratings 32 to 35 is measured. This measurement is done through target asymmetry, as revealed by comparing their intensities in the +1 order and −1 order dark field images (the intensities of other corresponding higher orders can be compared, e.g. +2 and −2 orders) to obtain a measure of the intensity asymmetry. At step S1, the substrate, for example a semiconductor wafer, is processed through a lithographic apparatus, such as the lithographic cell of FIG. 2, one or more times, to create a target including the gratings 32-35. At S2, using the metrology apparatus of FIG. 3, an image of the gratings 32 to 35 is obtained using only one of the first order diffracted beams (say −1). At step S3, whether by changing the illumination mode, or changing the imaging mode, or by rotating substrate W by 180° in the field of view of the metrology apparatus, a second image of the gratings using the other first order diffracted beam (+1) can be obtained. Consequently the +1 diffracted radiation is captured in the second image.

Note that, by including only half of the first order diffracted radiation in each image, the 'images' referred to here are not conventional dark field microscopy images. The individual target lines of the targets will not be resolved. Each target will be represented simply by an area of a certain intensity level. In step S4, a region of interest (ROI) is identified within the image of each component target, from which intensity levels will be measured.

Having identified the ROI for each individual target and measured its intensity, the asymmetry of the target, and hence overlay error, can then be determined. This is done (e.g., by the processor PU) in step S5 comparing the intensity values obtained for +1 and −1 orders for each target 32-35 to identify their intensity asymmetry, e.g., any difference in their intensity. The term "difference" is not intended to refer only to subtraction. Differences may be calculated in ratio form. In step S6 the measured intensity asymmetries for a number of targets are used, together with knowledge of any known imposed overlay biases of those targets, to calculate one or more performance parameters of the lithographic process in the vicinity of the target T. In the applications described herein, measurements using two or more different measurement recipes will be included. A performance parameter of great interest is overlay. As will be described later, the novel methods also allow other parameters of performance of the lithographic process to be calculated. These can be fed back for improvement of the lithographic process, and/or used to improve the measurement and calculation process of FIG. 6 itself.

In the prior applications, mentioned above, various techniques are disclosed for improving the quality of overlay measurements using the basic method mentioned above. These techniques will not be explained here in further detail. They may be used in combination with the techniques newly disclosed in the present application, which will now be described.

FIG. 7 shows schematic cross sections of targets (overlay gratings), with different biases. These can be used as the target T on substrate W, as seen in FIGS. 3 and 4. Gratings with periodicity in the X direction are shown for the sake of example only. Different combinations of these gratings with different biases and with different orientations can be provided separately or as part of a target.

Starting with FIG. 7(a) a target 600 formed in two layers, labeled L1 and L2, is shown. In the lowermost or bottom layer L1, a first structure (the lowermost or bottom structure), for example a grating, is formed by features 602 and spaces 604 on a substrate 606. In layer L2 a second structure, for example a grating, is formed by features 608 and spaces 610. (The cross-section is drawn such that the features 602, 608 (e.g., lines) extend into the page.) The grating pattern repeats with a pitch P in both layers. Features 602 and 608 may take the form of lines, dots, blocks and via holes. In the situation shown at (a), there is no overlay contribution due to misalignment, e.g., no overlay error and no imposed bias, so that each feature 608 lies exactly over a feature 602 in the first structure.

At FIG. 7(b), the same target with a first known imposed bias +d is shown, such that the features 608 of the first structure are shifted by a distance d to the right, relative to the features of the second structure. The bias distance d might be a few nanometers in practice, for example 10 nm-20 nm, while the pitch P is for example in the range 300-1000 nm, for example 500 nm or 600 nm. At (c) we see another feature with a second known imposed bias −d, such that the features of 608 are shifted to the left. Biased gratings of this type shown at (a) to (c) are well known in the art, and used in the prior applications mentioned above.

FIG. 7(d) shows schematically a phenomenon of structural asymmetry, in this case structural asymmetry in the first structure (bottom grating asymmetry). The structural asymmetry comprises two different asymmetry effects. One such asymmetry effect is bottom grating deformation error. The features in the gratings at (a) to (c), are shown as perfectly square-sided, when a real feature would have some slope on the side, and a certain roughness. Nevertheless they are intended to be at least symmetrical in profile. The features 602 and/or spaces 604 at (d) in the first structure no longer have a symmetrical form at all, but rather have become distorted by processing steps, resulting in a first structure distortion. Thus, for example, a bottom surface of each space has become tilted. Side wall angles of the features and spaces have become asymmetrical also. The other asymmetry effect is geometric center shift error, which results in a perceived center shift of the first structure which is dependent on the measurement radiation recipe (e.g. wavelength and/or polarization).

As a result of this structural asymmetry, the overall target asymmetry of a target will comprise an overlay contribution independent of structural asymmetry (i.e., an overlay contribution due to misalignment of the first structure and second structure; itself comprised of overlay error and any known imposed bias) and a structural contribution due to this structural asymmetry in the target.

When overlay is measured by the method of FIG. 6 using only two biased gratings, the process-induced structural asymmetry cannot be distinguished from the overlay contribution due to misalignment, and overlay measurements (in particular to measure the undesired overlay error) become unreliable as a result. Structural asymmetry in the first structure (bottom grating) of a target is a common form of structural asymmetry. It may originate, for example, in the substrate processing steps such as chemical-mechanical polishing (CMP), performed after the first structure was originally formed.

In WO 2013143814 A1, it is proposed to use of three or more component gratings to measure overlay by a modified version of the method of FIG. 6. Using three or more gratings of the type shown in FIGS. 7(a) to (c) are used to obtain overlay measurements that are to some extent corrected for structural asymmetry in the target gratings, such as is caused by bottom grating asymmetry in a practical lithographic process. However, this method requires a new target design (e.g. different to that illustrated in FIG. 4) and therefore a new reticle will be required. Furthermore, the target area is larger and therefore consumes more substrate area. In addition, the phase element of the overlay contribution resultant from structural asymmetry is ignored in this and other prior art methods, meaning that the corrections are not as accurate as they could be if the phase element was also corrected for.

Figure 8:
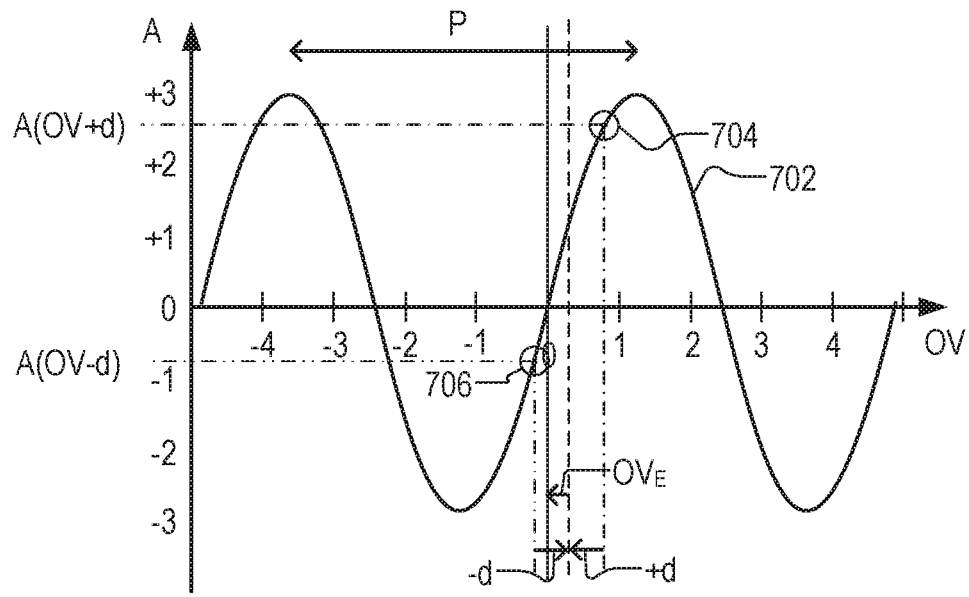
FIG. 8 illustrates known principles of overlay measurement in an ideal target, not subject to structural asymmetry.
Figure 9:
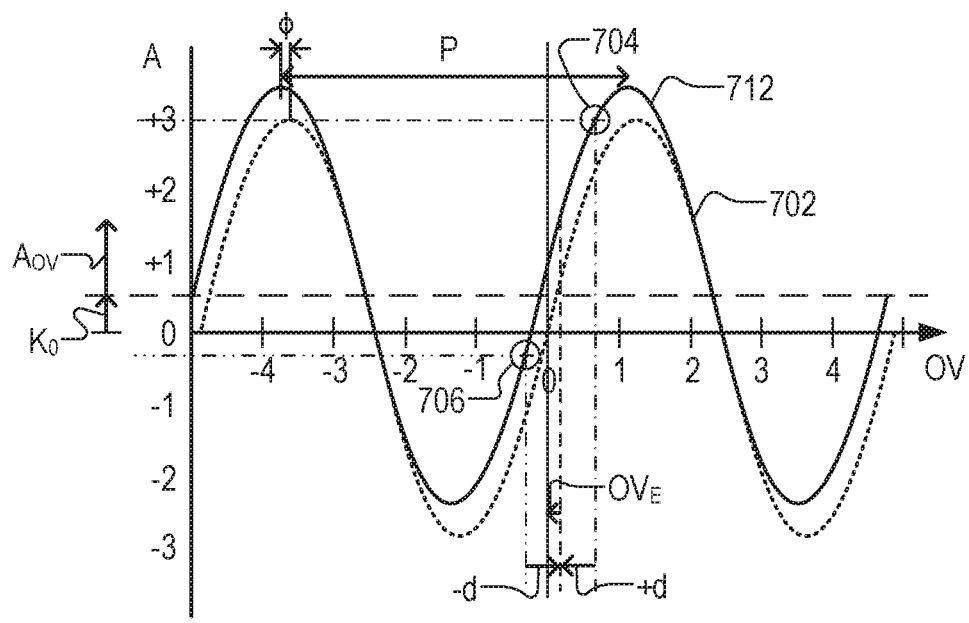
FIG. 9 illustrates a principle of overlay measurement in a non-ideal target, with correction of structural asymmetry as disclosed in embodiments of the invention.

In FIG. 8 a curve 702 illustrates the relationship between overlay OV and intensity asymmetry A for an 'ideal' target having zero offset and no structural asymmetry within the individual gratings forming the target, and in particular within the individual gratings of the first structure. Consequently, the target asymmetry of this ideal target comprises only an overlay contribution due to misalignment of the first structure and second structure resultant from a known imposed bias and overlay error OVE. This graph, and the graph of FIG. 9, is to illustrate the principles behind the disclosure only, and in each graph, the units of intensity asymmetry A and overlay OV are arbitrary. Examples of actual dimensions will be given further below.

In the 'ideal' situation of FIG. 8, the curve 702 indicates that the intensity asymmetry A has a non-linear periodic relationship (e.g., sinusoidal relationship) with the overlay. The period P of the sinusoidal variation corresponds to the period or pitch P of the gratings, converted of course to an appropriate scale. The sinusoidal form is pure in this example, but can include harmonics in real circumstances.

As mentioned above, biased gratings (having a known imposed overlay bias) can be used to measure overlay, rather than relying on a single measurement. This bias has a known value defined in the patterning device (e.g. a reticle) from which it was made, that serves as an on-wafer calibration of the overlay corresponding to the measured intensity asymmetry. In the drawing, the calculation is illustrated graphically. In steps S1-S5, intensity asymmetry measurements A+d and A−d are obtained for gratings having imposed biases +d an −d respectively (as shown in FIGS. 7 (b) and (c), for example). Fitting these measurements to the sinusoidal curve gives points 704 and 706 as shown. Knowing the biases, the true overlay error OVE can be calculated. The pitch P of the sinusoidal curve is known from the design of the target. The vertical scale of the curve 702 is not known to start with, but is an unknown factor which can be referred to as a 1st harmonic proportionality constant, K1. This constant K1 is a measure of the sensitivity of the intensity asymmetry measurements to the target.

In equation terms, the relationship between overlay error OVE and intensity asymmetry A is assumed to be:

$$A_{\pm d} = K_1 \sin(OV_E \pm d) \qquad (1)$$

where overlay error $OV_E$ is expressed on a scale such that the target pitch P corresponds to an angle $2\pi$ radians. Using two measurements of gratings with different, known biases (e.g. +d and −d) the overlay error $OV_E$ can be calculated using:

$$OV_E = \operatorname{atan}\left(\frac{A_{+d} + A_{-d}}{A_{+d} - A_{-d}} \cdot \tan(d)\right) \qquad (2)$$

FIG. 9 shows a first effect of introducing structural asymmetry, for example the bottom grating asymmetry illustrated in FIG. 7(d). The 'ideal' sinusoidal curve 702 no longer applies. However, at least approximately, bottom grating asymmetry or other structural asymmetry has the effect of adding an intensity shift term K0 and a phase shift term φ to the intensity asymmetry $A_{\pm d}$. The resulting curve is shown as 712 in the diagram, with label K0 indicating the intensity shift term, and label φ indicating the phase offset term. Intensity shift term K0 and phase shift term φ are dependent upon a combination of the target and a selected characteristic of the measurement radiation, such as the wavelength and polarization of the measurement radiation (the "measurement recipe"), and is sensitive to process variations. In equation terms, the relationship used for calculation in step S6 becomes:

$$A_{\pm d} = K_0 + K_1 \sin(OV_E \pm d + \phi) \qquad (3)$$

Where there is structural asymmetry, the overlay model described by Equation (2) will provide overlay error values which are impacted by the intensity shift term K0 and phase shift term $\phi$, and will be inaccurate as a consequence. The structural asymmetry will also result in differences in measurements of the same target using different measurement recipes, when mapping the overlay error, because intensity and phase shift are wavelength dependent. At present there is no method which is able to optimize selection of the target-measurement recipe combination so as to obtain more accurate overlay error measurements, nor is there a method to remove the overlay contribution due to structural asymmetry effectively, thereby correcting the overlay error measurements. Therefore, slight changes in substrate processing, or changes in the measurement recipe will lead to overlay variation, thereby impacting the overlay control loop APC (Automatic Process Control) and the device yield.

The overlay calculations of modified step S6 rely on certain assumptions. Firstly, it is assumed intensity asymmetry behaves as a sine function of the overlay, with the period P corresponding to the grating pitch. These assumptions are valid for present overlay ranges. The number of harmonics can be designed to be small, because the small pitch-wavelength ratio only allows for a small number of propagating diffraction orders from the grating. However, in practice the overlay contribution to the intensity asymmetry due to misalignment may not necessarily be truly sinusoidal, and may not necessarily be completely symmetrical about OV=0.

It is proposed to measure the target asymmetry of a target, and therefore overlay which does not neglect the effect of the structural asymmetry, while allowing the use of current target designs such as those illustrated in FIG. 4. This modelling may be performed as a modification to step S6 in the method illustrated in FIG. 6. The method proposed can calculate overlay errors accurately using real substrate measurement data, and which can determine the optimal or preferred combination of targets and measurement recipes. No simulation or reconstruction is needed.

The proposed method relies on the inventors' observation that, for the overlay range of interest, both the intensity term and phase term of the overlay contribution due to structural asymmetry is independent of the overlay contribution due to misalignment.

FIG. 10(*a*) shows an incident measurement radiation beam 800 onto a target comprising a first structure L1 and second structure L2 for the case where the second structure comprises no structural asymmetry. The resultant +1 diffraction order 810+ from the first structure has an intensity $Be^{j\beta}$ and the +1 diffraction order 820+ from the second structure has an intensity $Ce^{j\alpha}$. These intensities combine to produce an intensity I+1 for the +1 diffraction order of the target:

$$I_{+1} = |Ce^{j\alpha} + Be^{j\beta}|^2 = B^2 + C^2 + 2BC \times \cos[\beta + \alpha] \qquad (4)$$

where: B and C are intensity scaling factors, $$\alpha = 2\pi \frac{OV}{P}, \beta = 4\pi \frac{T}{\lambda},$$

OV is the overlay, P is the target pitch, T is the target thickness and $\lambda$ is the measurement radiation wavelength.

Similarly, the resultant −1 diffraction order 810⁻ from the first structure has an intensity $Be^{j\beta}$ and the −1 diffraction order 820⁻ from the second structure has an intensity $Ce^{-j\alpha}$. These intensities combine to produce an intensity I−1 for the −1 diffraction order of the target:

$$I_{-1} = |Ce^{-j\alpha} + Be^{j\beta}|^2 = B^2 + C^2 + 2BC \times \cos[\beta - \alpha] \qquad (5)$$

FIG. 10(*b*) shows an incident radiation beam 800 onto a target comprising a first structure L1 and second structure L2 for the case where the first structure comprises structural asymmetry (structural asymmetry tends to be found in the bottom structure). Because of the structural asymmetry in the first structure, the +1 and −1 diffraction orders from the first structure are not the same. In the specific example shown here the +1 diffraction order 810+ from the first structure has an intensity $Be^{j\beta}$, while the −1 diffraction order 810'− from the first structure has an intensity $B'e^{j\beta'}$, where B' is different to B and $\beta'$ is different to $\beta$. Consequently, in this example, the intensities combine to produce an intensity I−1 for the −1 diffraction order of the target (intensity I+1 is the same as Equation (4)):

$$I_{+1} = |Ce^{-j\alpha} + B'e^{j\beta'}|^2 = B'^2 + C^2 + 2B'C \times \cos[\beta' - \alpha] \qquad (6)$$

Overall structural asymmetry, as already discussed, comprises a first structure deformation error and a geometric center shift error $\Delta\alpha$. It has been determined that the first structure deformation error comprises a first structure intensity difference $\Delta B$ and a bottom grating phase difference $\Delta\beta$. The first structure intensity difference $\Delta B$ contributes to an intensity term error and both bottom grating phase difference $\Delta\beta$ and geometric center shift error $\Delta\alpha$ contribute to a phase term error. Consequently, derived from Equations (4) and (6), when performing overlay measurements using targets with known imposed biases +d and −d, the intensity asymmetry can be formulated in terms of a phase term and an intensity term (the + and − superscript denotes the order of the measurement radiation beam and the +d and −d subscript denotes the target bias):

$$A^{+d} = \qquad (7)$$
$$I_{+1}^{+d} - I_{-1}^{+d} = 2BC \times \cos(\alpha + \varepsilon + \beta) - 2B'C \times \cos(\alpha + \varepsilon - \beta') + B^2 - B'^2$$

$$A^{-d} = \qquad (8)$$
$$I_{+1}^{-d} - I_{-1}^{-d} = 2BC \times \cos(\alpha - \varepsilon + \beta) - 2B'C \times \cos(\alpha - \varepsilon - \beta') + B^2 - B'^2$$

$$\alpha^{+d} = 2\pi \frac{OV_E + d}{P} = \alpha + \varepsilon, \alpha^{-d} = 2\pi \frac{OV_E - d}{P} = \alpha - \varepsilon,$$

$$\alpha = 2\pi \frac{OV_E}{P}, \varepsilon = 2\pi \frac{d}{P},$$

where:

$$\beta = 4\pi \frac{T}{\lambda}, \frac{OV_E}{P} << 1 \Rightarrow \sin(\alpha) \approx \alpha \text{ and } \cos(\alpha) \approx 1$$

In each of Equation (7) and Equation (8), the "intensity term" of the asymmetry signal $A^{\pm d}$ (the terms which impact the intensity shift term) comprises the last two terms ($B^2 - B'^2$) of the equation. The "phase term" of the asymmetry signal $A^{\pm d}$ (the terms which impact the phase shift term) comprises the remaining terms of these equations. By applying these equations into the equation for the overlay contribution due to structural asymmetry $OV_{SA}$, the following is obtained:

$$OV_{SA} = \qquad (9)$$

$$d \times \frac{A^{+d} + A^{-d}}{A^{+d} - A^{-d}} - OV_E = \left\{ \left( \frac{B \times \cos(\alpha+\beta) - B' \times \cos(\alpha-\beta')}{-B \times \sin(\alpha+\beta) + B' \times \sin(\alpha-\beta')} - \alpha \right) + \right.$$

$$\left. \left( \frac{2(B^2 - B'^2)}{-4BC \times \sin(\alpha+\beta) + 4B'C \times \sin(\alpha-\beta')} \right) \right\} \times \frac{p}{2\pi}$$

assuming $\cos(d) \cong 1$, $\sin(d) \cong d$

The underlined term is the intensity term of the overlay contribution due to structural asymmetry $OV_{SA}$ and the remainder is the phase term of the overlay contribution due to structural asymmetry $OV_{SA}$.

Provided that $\beta \neq 0$ and $\beta' \neq 0$ (or are not close to 0), and the overlay range is small (e.g., within +/−20 nm) such that $\alpha$ is very small and $\sin \alpha \approx \alpha$, then:

$$OV_{SA} \approx \frac{B \times \cos(\beta) - B' \times \cos(\beta')}{-B \times \sin(\beta) + B' \times \sin(\beta')} \times \frac{p}{2\pi} + k \times 2(B^2 - B'^2) \qquad (10)$$

Once again underlined term is the intensity term and the remainder is the phase term. k is a constant.

The assumptions made to obtain Equation (10) are valid for most cases. If $\beta \approx 0$ or $\beta' \approx 0$, the stack sensitivity would be very small and the measurement recipe would be filtered out during recipe optimization. Also, the overlay range would not be expected to exceed +/−20 nm. Therefore, in most cases the overlay contribution due to structural asymmetry $OV_{SA}$ is constant and independent of overlay. As such, plots of overlay with and without the overlay contribution due to structural asymmetry would comprise essentially parallel lines within an overlay range of small overlay. This can be seen on FIG. 9, around OV=0.

The total overlay OV (i.e., the measured overlay) can be represented in terms of the overlay contribution due to structural asymmetry $OV_{SA}$ and an overlay contribution independent of structural asymmetry $OV_{NSA}$:

$$OV = OV_{NSA} + OV_{SA} \qquad (11)$$

The overlay contribution independent of structural asymmetry $OV_{NSA}$ may comprise the overlay error $OV_E$ (any unintentional misalignment of the layers) and/or any known imposed bias d. Separating the overlay contribution due to structural asymmetry $OV_{SA}$ into constituent intensity term $OV_{SAI}$ and phase term $OV_{SA\phi}$ yields:

$$OV = OV_{NSA} + (OV_{SAI} + OV_{SA\phi}) \qquad (12)$$

As can be derived from Equation (10), constituent intensity term $OV_{SAI}$ of the overlay contribution due to structural asymmetry is proportional to the structural asymmetry in the lowermost grating BGA (where $\gamma$ is the proportionality constant):

$$OV_{SAI} = \gamma \times BGA \qquad (13)$$

Assuming that there is a relationship G (which can be referred to as the process robustness index) between intensity term $OV_{SAI}$ and phase term $OV_{SA\phi}$:

$$OV_{SA\phi} = G \times OV_{SAI} \qquad (14)$$

Equation (12) can therefore be rewritten:

$$OV = OV_{NSA} + \gamma \times BGA + G \times OV_{SAI} \qquad (15)$$

$$= OV_{NSA} + \gamma \times BGA + G \times \gamma \times BGA$$

$$= OV_{NSA} + \xi \times BGA, \text{ where } \xi = \gamma + G \times \gamma$$

Using Equation (11), it can be seen that overlay contribution due to structural asymmetry $OV_{SA}$ is equal to the product of relationship function $\xi$ and the structural asymmetry in the lowermost grating BGA:

$$OV_{SA} = \xi \times BGA \qquad (16)$$

The relationship function $\xi$ can be described either as a constant or as a function of arbitrary parameters p. The arbitrary parameters may include, for example, one or more of measurement position on the substrate (more specifically measurement position in terms of x, y, radius (r) and or angle ($\theta$)) Stack Sensitivity, K. The relationship function $\xi$ can be determined by measuring targets on a substrate, at n measurement positions on the substrate, using a plurality (m) different measurement recipes. Different measurement recipes may differ in terms of different wavelength and/or polarization of the measurement radiation. Where the arbitrary parameter is position on substrate, then Equation (16) may be written as:

$$OV_{SAi,j} = \xi_i(p_{k,j}) \times BGA_{i,j} \qquad (17)$$

where index i is the measurement recipe index from measurement recipe 1 to measurement recipe m, index j is the substrate position index from measurement position 1 to measurement position n, and index k is the parameter index from arbitrary parameter 1 to arbitrary parameter x (for example, two parameters if measurement position is used and is separated in terms of x and y).

Equation (11) can be rewritten into Equation (17) for all measurement positions on the substrate:

$$OV_{i,j} = OV_{NSAj} + OV_{SAi,j} \qquad (18)$$

$$= OV_{NSAj} + \xi_i(p_{k,j}) \times BGA_{i,j}$$

Provided that the solution to relationship function $\xi_i(p_{k,j})$ can be determined, the overlay contribution due to structural asymmetry $OV_{SA}$ can be corrected for. Where the relationship function is a function of x parameters, for n measurement positions, measured using m measurement recipes, then m*n simultaneous equations can be obtained, comprising a total of n+x*m unknowns. The simultaneous equations may be versions of Equation (18) for each of n measurement positions and each of m measurement recipes. Provided that m>1 and m*n is sufficient such that the number of simultaneous equations is greater than the number of unknowns, then a solution for the relationship function $\xi_i(p_{k,j})$ can be determined by resolving the set of simultaneous equations.

Where the relationship function $\xi_i(p_{k,j})$ is a linear function of x parameters (k=1 to x), then it may be rewritten as:

$$\xi_i(p_{k,j}) = \xi_{0,i} + \xi_{1,i} \times p_{1,j} + \xi_{2,i} \times p_{2,j} + \ldots + \xi_{x,i} \times p_{x,j} \qquad (19)$$

This can be substituted into Equation (18), such that the simultaneous equations (one equation for each combination of measurement recipe i and measurement position j) take the form of:

$$OV_{i,j} = OV_{NSA\,j} + (\xi_{0,i} + \xi_{1,i} \times p_{1,j} + \xi_{2,i} \times p_{2,j} + \ldots + \xi_{x,i} \times p_{x,j}) \times BGA_{i,j} \qquad (20)$$

These simultaneous equations can be written into matrix form:

$$A = B \times X \tag{21}$$

where A is the matrix of the total (measured) overlay $OV_{i,j}$ (e.g. a 1×(m*n) matrix), B is the matrix coefficient comprising the coefficients of the relationship function terms and the coefficients of the $OV_{NSA\ j}$ terms. The coefficients of the relationship function terms comprise the product of the measured bottom grating asymmetry $BGA_{i,j}$ and the parameters of the relationship function $p_{x,j}$. Matrix X is the unknown terms matrix populated with the relationship function terms $\xi_{k,i}$ and the overlay contribution independent of structural asymmetry $OV_{NSA\ j}$.

Provided that the rank of matrix B is larger than the number of unknowns in matrix X, the simultaneous equations can be resolved by solving the matrix equation for the unknowns. This method of solving the simultaneous equations is referred to herein as the matrix method.

Once the simultaneous equations are resolved, the corrected overlay $V_{COR\ i,j}$ specific to each measurement point and each measurement recipe can be found by:

$$OV_{COR\ i,j} = OV_{i,j} - \xi_i(p_{k,j}) \times BGA_{i,j} \tag{22}$$

where $OV_{i,j}$ is the measured overlay and $BGA_{i,j}$ is the measured bottom grating asymmetry.

It should be that the calculated corrected overlay $OV_{COR\ i,j}$ is the same for each measurement recipe and therefore also equal to the overlay contribution independent of structural asymmetry $OV_{NSA\ j}$ solved for when resolving the simultaneous equations. However, due to variations in measurement accuracy and other impacts, this is not necessarily the case in reality. Where there is variation in the corrected overlay $OV_{COR\ i,j}$ as calculated, a quantification of how well the simultaneous equations describe the overlay contribution due to structural asymmetry can be determined. Furthermore, the sets of corrected overlay results corresponding to different measurement recipes can be evaluated and preferred measurement recipes identified.

To quantify how well a set of simultaneous equations describe the overlay contribution due to structural asymmetry, m+1 overlay maps may be determined. This will comprise one corrected overlay map for each of the m measurement recipes, describing the corrected overlay across the substrate (e.g., determined using Equation (19)) and a recipe independent overlay map describing the overlay contribution independent of structural asymmetry $OV_{NSA\ j}$ across the substrate (e.g., determined when solving the simultaneous equations).

With these overlay maps, for each of the n measurement positions on the substrate, a difference metric can be calculated describing the difference in the overlay values at corresponding measurement positions in each combination of the recipe independent overlay map and different pairs of the corrected overlay maps. This difference metric can be used as a quantification of how well the simultaneous equations describe the overlay contribution due to structural asymmetry. Ideally this difference metric should be small, as the difference between overlay values should be small (actually zero).

In an embodiment, the difference metric may comprise the root-mean-square R of the difference in the overlay values at corresponding measurement positions in each combination of the recipe independent overlay map and different pairs of the corrected overlay maps:

$$R = \sqrt{\frac{1}{n \cdot \frac{m(m+1)}{2}} \left[ \sum_{j=1}^{n} \sum_{i=1}^{m} (OV_{NSAj} - OV_{CORi,j})^2 + \sum_{j=1}^{n} \sum_{i \neq r, i, r=1}^{m} (OV_{CORi,j} - OV_{CORr,j})^2 \right]} \tag{23}$$

where the index r indicates a measurement recipe of the m measurement recipes other than that indicated by index i.

The difference metric (e.g., the root-mean-square R measure above) may be used as an indicator to determine preferred measurement recipes. Such a method may comprise calculating the difference metric for every combination of m−1 measurement recipes out of the m measurement recipes. The resultant m−1 difference metric values can then be evaluated; the smallest of the m−1 difference metric values indicating that the corresponding combination of m−1 measurement recipes is best and therefore the measurement recipe not included in that combination is the recipe which results in the worst corrections to the overlay. This measurement recipe can then be discarded and the method performed with the remaining measurement recipes. These steps can be repeated until m=2 (or other low number). The value of the difference metric should decrease with decreasing number of measurement recipes. A difference threshold may be determined, such that the preferred measurement recipe combination comprises the maximum number of measurement recipes for which the corresponding difference metric is below this difference threshold. This preferred measurement recipe combination can then be used in subsequent overlay measurements.

The order that measurement recipes are discarded can also be used as a ranking for the measurement recipe such that those discarded earliest in the above method are ranked lower than those discarded later, and those not discarded ranked highest of all.

Figure 11:
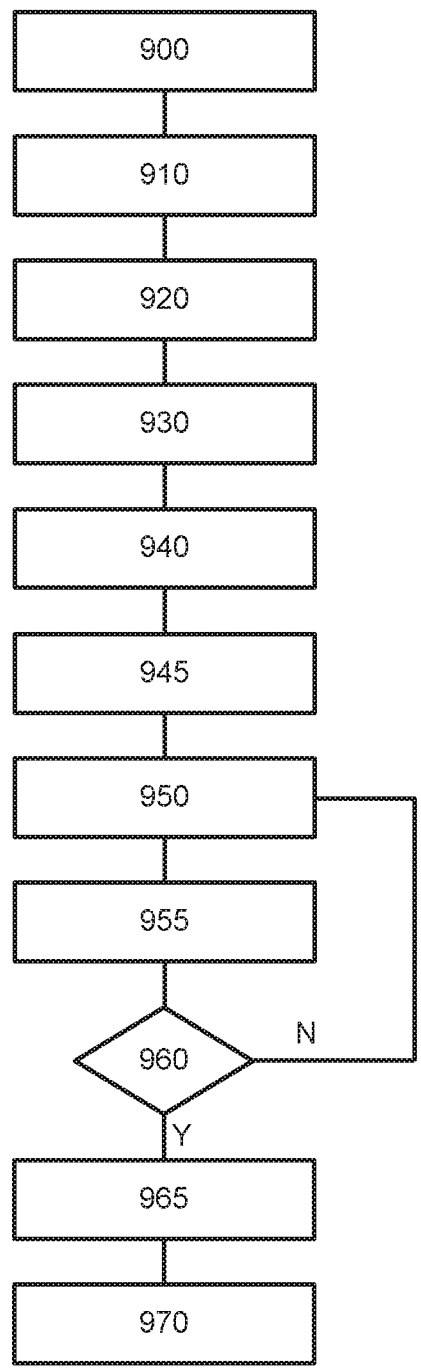
FIG. 11 is a flowchart of the steps of a method according to a first exemplary embodiment of the invention.

FIG. 11 is a flowchart of the steps of a method for measuring overlay according to an exemplary embodiment. The method is performed on a substrate comprising a number of targets. The steps are as follows, and are then described in greater detail thereafter:

900—Obtain a plurality of first measurements comprising measurements of structural asymmetry relating to a plurality of first structures, and more specifically measurements of bottom grating asymmetry BGAi,j on targets at n different values of a first parameter, e.g., measurement locations (j=1 to n) using m measurement radiations (i=1 to m);

910—Obtain a plurality of second measurements, said second measurements comprising measurements of target asymmetry relating to a plurality of targets, and more specifically a measurement of overlay OVi,j on targets with said n different values of a first parameter, e.g., measurement locations (j=1 to n) using said m measurement radiations (i=1 to m);

920—Arrange the measured bottom grating asymmetry BGAi,j and overlay OVi,j values into a set of simultaneous equations relating these values in terms of a relationship function $\xi_i(p_{k,j})$;

930—Solve simultaneous equations to obtain values for relationship function $\xi_i(p_{k,j})$;

940—Find corrected overlay; and optionally:

945—Determine overlay maps comprising correction overlay maps for each measurement recipe and a measurement recipe independent overlay map for the overlay contribution independent of structural asymmetry;

950—Determine a difference metric for every combination of m−1 measurement recipes out of the m measurement recipes;
955—Discard worst measurement recipe (m=m−1);
960—Does m=2 (or other low value >1)?
965—Determine preferred measurement recipes; and
970—Rank measurement recipes.

At step 900, the structural asymmetry BGAi,j in the first structures of each target is measured at n different values of a first parameter using m different measurement radiations (m>1) thereby obtaining a plurality (m*n) of first measurements, each of said first measurements relating to a different combination of first parameter value and measurement radiation. The first parameter may be position on the substrate. Different measurement radiations may differ from each other in terms of the measurement recipe (wavelength and/or polarization).

The first measurements may be performed before exposure of second structures which, together with the first structures, make up the targets. In an embodiment, a measurement of structural asymmetry and a measurement of overlay can be obtained by a single measurement. This can be achieved by measuring together a target structure comprising two neighboring structures, one comprising a first structure only (having no second structure exposed over it) and the other comprising a complete target (comprising a first structure overlaid with a second structure).

At step 910, the overlay OVi,j (measurements of target asymmetry) of each target is measured at said n different values of a first parameter using said m different measurement radiations (m>1) thereby obtaining a plurality (m*n) of second measurements, each of said second measurements relating to a different combination of first parameter value and measurement radiation.

At step 920, the first measurement and second measurements are arranged into a set of simultaneous equations relating these values in terms of a relationship function $\xi_i(p_{k,j})$. The simultaneous equations may each take the form of Equation (18) or Equation (20).

At step 930 the simultaneous equations are solved to find values for the relationship function $\xi_i(p_{k,j})$. This may be performed using the matrix method described above, where possible, or any other suitable method.

At step 940, the corrected overlay values can be found. This may comprise finding corrected overlay values per first parameter value (e.g., per position) and per measurement radiation using Equation (22) or using the overlay contribution independent of structural asymmetry $OV_{NSA}$ solved for when resolving the simultaneous equations.

At step 945, a set of corrected overlay values (correction overlay map) for each measurement radiation is determined, and a set of measurement recipe independent overlay values (measurement recipe independent overlay map) is determined.

At step 950 a difference metric may be obtained for each combination of m−1 measurement radiations using, for example, Equation (23). At step 955, the worst performing measurement radiation is discarded. This may be the measurement radiation which was excluded when calculating the best performing difference metric. This is repeated until m=2 (step 960).

At step 965, a preferred measurement radiation combination may be identified. This may comprise the maximum number of measurement recipes for which the corresponding difference metric is below a difference threshold.

At step 970, the measurement radiations may be ranked according to the order that measurement recipes are discarded at step 955.

Where the relationship function $\xi$ is constant across the substrate then, by determining the constant relationship function $\xi$, it is possible to determine the overlay which is independent of structural asymmetry $OV_{NSA}$ using two different measurement recipes. In this case:

$$OV_A = OV_{NSAA} + \xi_A * BGA_A$$

$$OV_B = OV_{NSAB} + \xi_B * BGA_B$$

$$\Delta OV = \xi_A * BGA_A - \xi_B * BGA_B + C \qquad (24)$$

where the subscripts A and B denote terms attributable to measurements made using measurement recipe A (a first measurement recipe) and measurement recipe B (a second measurement recipe) respectively; with OVA and OVB being the measured overlay with measurement recipe A and measurement recipe B respectively. ΔOV is the difference between the measured overlay OVA using measurement recipe A and the measured overlay OVB using measurement recipe B. Equation (24) is further based upon the assumption that OVNSAA=OVNSAB=OVNSA. In other words, the overlay which is independent of structural asymmetry is assumed to be independent of the measurement recipe. It is only the structural asymmetry signal BGA which is dependent on measurement recipe.

In one embodiment, the constant relationship function $\xi$ can be found by determining the relationship between the measured structural asymmetry in lowermost grating BGAA using measurement recipe A, the measured structural asymmetry in lowermost grating BGAB using measurement recipe B and the difference in overlay measurements ΔOV between measurement recipes A and B. One method for finding this relationship involves constructing a 3D plot of BGAA, BGAB and ΔOV, and is referred to as the 3D plot method herein. The validity of assuming (e.g. fitting) a constant relationship function when the measurements of all targets show a linear/planar correlation as described below.

FIG. 12 is a flowchart of the steps of a method for measuring overlay according to an exemplary embodiment. The method is performed on a substrate comprising a number of targets. The steps are as follows, and are then described in greater detail thereafter:
1000—Measure BGAA and BGAB on targets with Recipe A and Recipe B, respectively;
1010—Measure and OVA and OVB on targets with Recipe A and Recipe B, respectively;
1020—Plot BGAA, BGAB and ΔOV on 3D plot;
1030—Find relationship functions $\xi$A and $\xi$B; and
1040—Find corrected overlay.

At step 1000, the structural asymmetry BGAA in the first structures of each target (or subsets thereof) is measured using a first measurement recipe A thereby obtaining a first measurement of structural asymmetry in said first structures. Also, the structural asymmetry BGAB in the first structures of each target (or subsets thereof) is measured using a second measurement recipe B thereby obtaining a second measurement of structural asymmetry in said first structures.

At step 1010, the overlay OVA of each target (or subsets thereof) is measured using the first measurement recipe A, thereby obtaining a first measurement of target asymmetry in said targets. Also, the overlay OVB of each target (or subsets thereof) is measured using the second measurement recipe B, thereby obtaining a second measurement of target asymmetry in said targets.

At step 1020, a 3D plot may be constructed, plotting ΔOV (the difference of measured overlay OVA and measured overlay OVB) against the first measurement of structural asymmetry in said first structures BGAA, on one axis and the second measurement of structural asymmetry in said first structures BGAB on another axis.

Figure 13:
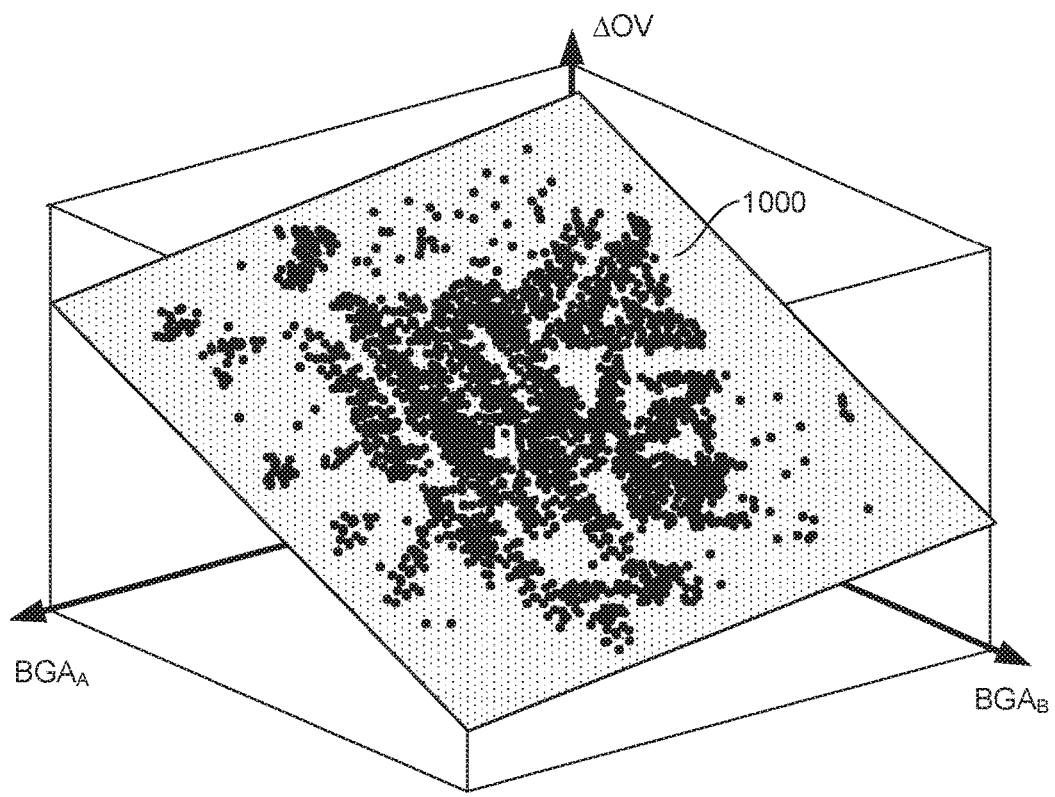
FIG. 13 illustrates an example of a 3-dimensional plot constructed during a step of the method of FIG. 12.

FIG. 13 shows an example of such a 3D plot. It comprises the overlay difference between measurement recipes ΔOV on the z-axis, and the measurements of structural asymmetry in said first structures BGAA and BGAB on the x and y axes respectively. As can be seen, there is good flat plane correlation between ΔOV and structural asymmetry measurements BGAA and BGAB of all the targets, the relationship defining a flat plane 1000. This good correlation indicates that the relationship functions ξA and ξB are each a constant and therefore can be determined accurately.

At step 1030, the relationship functions ξA and ξB are determined. Relationship functions ξA and ξB can be determined using Equation (24) or considering the slope of plane 1000 in both the x and y directions. The overlay measurement accuracy is related to the correlation between ΔOV and structural asymmetry measurements BGAA and BGAB. In theory, when the correlation shows a perfectly flat plane, the error caused by structural asymmetry can be completely eliminated and an error-free overlay fingerprint can be obtained. Where the plane is not perfectly flat, the slope error (a measure of non-correlation) can be determined and used as a measure of uncertainty in the overlay measurements.

At step 1040 the corrected overlay $OV_{NSA}$, that is the overlay contribution which is independent of structural asymmetry, can be found by:

$$OV_{NSA} = OV_A - \xi_A * BGA_A$$

$$OV_{NSA} = OV_B - \xi_B * BGA_B \qquad (25)$$

Both the matrix method of solving the simultaneous equations and the 3D plot method described in relation to FIG. 12 require good correlation between overlay and structural asymmetry for the different measurement radiation combinations. For the matrix method, this correlation does not need to be constant, but may take the form of a function. The 3D plot method, however, should show good flat plane correlation between ΔOV and structural asymmetry measurements BGAA and BGAB. Consequently, also disclosed is a method for identifying preferred target designs and also preferred combinations of target designs and measurement recipe pairs.

In an embodiment, a preferred target design with corresponding preferred measurement recipe combination can be identified. Once identified, the preferred target/recipe combination can be used in performing overlay measurements using one of the methods disclosed herein, as described above. It should be noted that preferred measurement recipe combinations will tend to correspond to particular target designs, such that preferred target/recipe combinations of target design and measurement recipe pairs are identified. A particular target design will not necessarily provide good results for all measurement recipe combinations, and a particular measurement recipe combination will not necessarily provide good results for all target designs. However, methods of target design selection optimization which are independent of the measurement recipe are also described.

Target designs may be varied in a number of ways. There may be variation in one or more parameters such as critical dimension, sidewall angle or pitch, for example. A number of candidate target designs may be evaluated, each showing variation in one or more of these parameters.

Measurement recipes may be varied in terms of parameters such as wavelength and/or polarization, for example. Different candidate measurement recipe combinations may be evaluated, each candidate measurement recipe combination showing variation in one or more of these parameters, for one, some or all of the measurement recipes comprised within the combination.

Figure 14:
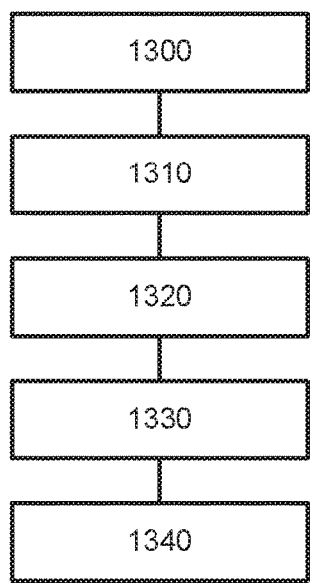
FIG. 14 is a flowchart of the steps of a method according to a third exemplary embodiment of the invention.

FIG. 14 is a flowchart of the steps of a method for optimizing target design selection according to an exemplary embodiment. The steps are as follows, and are then described in greater detail thereafter:

1300—Measure a plurality of candidate target designs with a plurality of candidate measurement recipe combinations;

1310—Construct 3D plots, simultaneous equations or matrices for each target/recipe combination of candidate target designs and candidate measurement recipe combinations;

1320—Identify target/recipe combinations with good correlation;

1330—Optionally, identify preferred target/recipe combination from flat plane and/or slope uncertainty for each identified target/recipe combination; and

1340—Identify preferred measurement recipe from the preferred target/recipe combination.

At step 1300 a plurality of candidate target designs are devised and multiple samples of each candidate target design are measured (including measurements of the first structure alone). These multiple samples of a plurality of candidate target designs may be measured from a single substrate or a number of substrates. Measurements of each set of samples of each candidate target design may then be acquired for a number of candidate measurement recipe combinations, wherein each candidate measurement recipe combination comprises two or more candidate measurement recipes. Where the 3D-plot method is being used, these candidate measurement recipe combinations will be candidate measurement recipe pairs (i.e., different Recipe A and/or Recipe B).

At step 1310, either simultaneous equations of a form similar to that of Equation (18), a matrix equation of a form similar to that of Equation (21) or plots similar to that illustrated in FIG. 12 and described at step 920 are made for each combination of candidate target design and candidate measurement recipe combination.

At step 1320, the target/recipe combinations which show the highest correlation between overlay and structural asymmetry measurements are identified. Specifically for the 3D plot method, target/recipe combinations which show the highest correlation between ΔOV and structural asymmetry measurements BGAA and/or BGAB are identified. This can be achieved by determining the correlation coefficient(s) for overlay (or ΔOV for the 3D plot method) and structural asymmetry measurements (BGAA and BGAB for the 3D plot method) for each target/recipe combination and selecting the target/recipe combinations for which the correlation coefficient is highest. The correlation calculation may be a R2 correlation. Where relationship function ξ is a constant, R2 correlation is a good index of the fitting. If relationship function ξ is not a constant, but a function, the residuals after fitting may be a better indication of the fitting quality. Identification of the target/recipe combinations can be made on the basis of a threshold (e.g., all target/recipe combinations with a correlation coefficient above a threshold value) or on the basis of a predetermined number of target/recipe combinations to be selected (e.g., selecting the 10 or 20 target/recipe combinations having the highest correlation). If only one target/recipe combination shows a good correlation, then this can be selected without performing the next step 1330. Similarly, if the matrix method is being used and flat plane correlation is not so important, then the target/recipe combination which shows the best correlation can be selected at this step without performing step 1330. However, performance of step 1330 is preferred for the 3D-plot method as this can determine whether this one target/recipe combination has a suitable flat plane correlation. If not, then it may be preferred to begin again with different candidate target designs and/or candidate measurement recipe pairs.

Step 1320 may optionally comprise identifying a target design which can be seen to outperform other target designs over the range of candidate measurement recipe combinations in the correlation determination. For example, a preferred target design may be identified if it shows good correlation for a greater number of measurement recipe combinations, or a better average correlation over the range of candidate measurement recipe pairs, compared to the other target designs.

At optional step 1330, the target/recipe combinations selected at step 1320 may be further evaluated. In particular, with respect to the 3D plot method where the relationship function $\xi$ is a constant, it should be appreciated that a high coefficient of correlation does not, in itself, indicate an ideal target/recipe combination. Even where there is a high coefficient of correlation between $\Delta OV$ and BGAA and BGAB, there may also be a strong inter-dependence between structural asymmetry measurements BGAA and BGAB. In such a case the 3D plot will tend to form a line, rather than a plane. This results in a large slope uncertainty (which is a measure of non-correlation) due to the freedom of rotation around the line axis. Therefore it is preferable that target/recipe combinations are identified which do not show this inter-dependency between structural asymmetry measurements BGAA and BGAB, for the two recipes (or for which this inter-dependency is smallest). Where more than two measurement recipes are used (for example the matrix method) this inter-dependency is not an issue; it is not important for all the measurement recipe combinations to have structural asymmetry measurements which show independence. Consequently, this step can be omitted.

Consequently, at step 1330, the target/recipe combination which shows the best correlation is selected. Using the 3D-plot method, this target/recipe combination can be the target/recipe combination showing the best flat plane correlation; these can be identified by considering the 3D-plots of the target/recipe combinations which show a high correlation and determining whether the points on said plot define a flat plane (rather than a line). The target/recipe combination for which the corresponding plot better defines a flat plane can then be selected. If this yields a target/recipe combination which demonstrates a clearly better flat plane correlation then this candidate measurement recipe target/recipe combination can be selected as the preferred target/recipe combination. If there are still a number of target/recipe combinations for which the determined flat plane correlation is similar or at an acceptable level, then another evaluation metric can be used. Such an evaluation metric may be the slope uncertainty of each plot. The slope uncertainty is a measure of overlay uncertainty. It is possible to use this uncertainty in the overlay measurements as an index of measurement recipe selection. Such a method may comprise fitting the plane of the 3D plot to the data points which comprise confidence bounds (thereby defining a confidence range for each point). Purely by way of example, it may be assumed that each data point has 95% confidence bounds. The will provide a measure of the slope uncertainty and therefore the overlay uncertainty. Multiplying a structural asymmetry measurement BGA by the confidence range will yield the uncertainty of the correction.

Step 1320 or step 1330 should identify a combination of target design and measurement recipe combination (or pair) which is optimized for overlay measurement. Therefore this method may be used to optimize selection of target design and measurement recipe combination for the methods described herein.

At optional step 1340, one of the measurement recipes of the measurement recipe combination identified at step 1330 may be chosen to be a preferred measurement recipe for overlay measurements where only measurement with one measurement recipe is possible or desirable (e.g., to maximize throughput). This preferred measurement recipe may be the recipe of the combination for which the corresponding measurement of structural asymmetry is smallest. Lower measured structural asymmetry will result in less correction, so the measured overlay should be closer to real overlay. The preferred recipe will correspond to the preferred target design.

When there is a constant relationship function $\xi$ for two recipes, the result using the 3D plot method will be the same as the result using matrix method. The principle of the matrix method is essentially similar to that of 3D method, except that the matrix can handle multiple measurement recipes simultaneously. Ideally the ranking of preferred recipes and/or preferred targets should be the same for both methods. However, by using the matrix method with more measurement recipes, noise in the calculated overlay contribution which is independent of structural asymmetry may be reduced compared to using the 3D plot method.

In an alternative embodiment to that described above, instead of constructing the 3-dimensional plot(s) of step 1020 and 1310, a 2-dimensional plot can be constructed. The 2-dimensional plot will be a plot of $\Delta OV$ against $\Delta BGA$, where $\Delta BGA$ is the difference between structural asymmetry measurements BGAA and BGAB of all targets. The correlation between $\Delta OV$ and $\Delta BGA$ can then be determined from the plot and, if there is sufficient correlation, the corrected overlay $OV_{NSA}$ can be determined. For there to be a straight line correlation between $\Delta OV$ and $\Delta BGA$, it must be the case that constant relationship functions $\xi A$ and $\xi B$ are the same (i.e. $\xi A = \xi B = \xi$). Where this is the case, the slope of the line provides the constant relationship function $\xi = \xi A = \xi B$. As before, the corrected overlay can then be calculated as already described using Equation (25). As with the 3D plot method, identification of preferred target designs and combinations of target designs and measurement recipe pairs can be identified by identifying those plots which show the best correlation or least slope uncertainty (of the line).

In an exemplary embodiment, to directly measure the structural asymmetry BGA, a methodology similar to standard overlay measurements (to obtain intensity asymmetries), as depicted in FIG. 6, is performed on the first structure (bottom grating) before the exposure of the second layer and therefore the formation of a second structure. Of course, as there is only the single layer being measured, there cannot be any overlay and the +d and −d "bias" of the target is not real (without a second layer, the +d "biased" target and the −d "biased" target will be in fact identical). The bottom grating asymmetry can then be calculated (per target) using:

$$BGA = \frac{I_{+d}^+ - I_{+d}^- + I_{-d}^+ - I_{-d}^-}{I_{+d}^+ + I_{+d}^- + I_{-d}^+ + I_{-d}^-} \quad (26)$$

where I is the measured intensity, the + and − superscript denoting the order of the measurement radiation beam and the +d and −d subscript denoting the target "bias" (e.g., $I_{+d}^+$ is the measured intensity when measuring a positively biased target using +1 order measurement illumination and $I_{+d}^-$ is the measured intensity when measuring a positively biased target using −1 order measurement illumination).

In the above embodiments, it is envisaged that the relationship function $\xi_i(p_{k,j})$ is determined in a calibration step, in particular due to the number of measurements which are required and the time that this would take. In such a calibration step, one or more substrates (which may be production substrates or specially exposed calibration substrates), are measured and the relationship function $\xi_i(p_{k,j})$ determined. This relationship function $\xi_i(p_{k,j})$ is then assumed to be non-varying and, as such, is used in determining overlay corrections in all subsequent substrates during production. However, such an approach does not take into account variation of this relationship function $\xi_i(p_{k,j})$ over time (e.g., substrate-to-substrate variations).

It is therefore proposed, in an optional embodiment, to periodically update the value of the relationship function $\xi_i(p_{k,j})$. This may be done by performing in-line metrology of production substrates, and making a determination (or correction) of the relationship function $\xi_i(p_{k,j})$ from these. The in-line metrology may comprise measuring only a subset of the target locations (overlay targets) measured during the calibration stage.

It is not possible to solve the simultaneous equations described above (Equations (18)-(21)) for the relationship function $\xi_i(p_{k,j})$ based on only on measurements of a single target. However, it is possible to find a suitable approximate solution, by solving to parameterize a realistic substrate model. Such a substrate model may take a form similar to models presently used for overlay modelling across a substrate, for example: a 10 parameter model, or an intra-field, high order process correction (i-HOPC) model (e.g. 3rd order). However, it should be appreciated that the actual model used in this embodiment may be decoupled from any overlay model also used (e.g., the model here may be in terms of different parameters compared to an overlay model used). In such an embodiment, the simultaneous equations (e.g., Equation (18)) will be adapted to include the model terms.

It is mentioned above that the structural asymmetry measurements and overlay measurements may not necessarily be performed on the same target. This will clearly be the case when measurements are performed in-line. In an embodiment, depending on distance within the field between the overlay target and corresponding structural asymmetry target, the resolution of the model may be adapted. This is because, due to stack/process variation over a field, the correlation of the results between the two targets will decrease with the distance between them. Therefore it may be more appropriate to use a more detailed (higher resolution) model only when these targets are close to each other (e.g., adjacent or at least within a quarter of the field size). Where the two targets are more separated, a more basic model may be used. In an embodiment, the in-line determination of the relationship function $\xi_i(p_{k,j})$ may be smoothed (e.g., averaged) over time.

This in-line determination of the relationship function $\xi_i(p_{k,j})$, and in particular its variance over time (e.g., substrate-to-substrate), can be used as a monitoring metric for the process conditions and/or measurement recipe used. Only a little variance over time is an indication that the process conditions and/or measurement recipe is robust. However, significant variation may indicate that the process conditions and/or measurement recipe is not sufficiently robust, and possibly should be changed.

In summary, the following are features made possible by the concepts described herein:

Feed forward (bottom grating) structural asymmetry characterization for correction of overlay error measurements in inline measurement;

More accurate overlay measurements can be obtained from overlay and bottom grating asymmetry measurements using two (or more) recipes via a simple and direct method;

Process-robust target and measurement recipe combinations can be identified using two recipes which having strong linear correlation between bottom grating asymmetry and differences in measured overlay error; and A preferred recipe can be determined from measured bottom grating asymmetry and overlay error uncertainty.

Theoretically, the methods described herein can completely remove errors caused by structural asymmetry, including those which result from the phase term of overlay error. Measurement recipe process-robustness also provides a good indication of linear $\xi_A$ factor. The methods described herein require no new reticle design, no change in metrology design and no increase in metrology target real-estate. The methods are also capable of broader application, for example, the structural asymmetry can be used for process stability monitoring.

While the targets described above are metrology targets specifically designed and formed for the purposes of measurement, in other embodiments, properties may be measured on targets which are functional parts of devices formed on the substrate. Many devices have regular, grating-like structures. The terms 'target grating' and 'target' as used herein do not require that the structure has been provided specifically for the measurement being performed. Further, pitch P of the metrology targets is close to the resolution limit of the optical system of the scatterometer, but may be much larger than the dimension of typical product features made by lithographic process in the target portions C. In practice the lines and/or spaces of the overlay gratings within the targets may be made to include smaller structures similar in dimension to the product features.

In association with the physical grating structures of the targets as realized on substrates and patterning devices, an embodiment may include a computer program containing one or more sequences of machine-readable instructions describing methods of measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the modified step S6 and so calculate overlay error or other parameters with reduced sensitivity to structural asymmetry.

The program may optionally be arranged to control the optical system, substrate support and the like to perform the steps S2-S5 for measurement of asymmetry on a suitable plurality of targets.

While the embodiments disclosed above are described in terms of diffraction based overlay measurements (e.g., measurements made using the second measurement branch of the apparatus shown in FIG. 3(a)), in principle the same models can be used for pupil based overlay measurements (e.g., measurements made using the first measurement branch of the apparatus shown in FIG. 3(a)). Consequently, it should be appreciated that the concepts described herein are equally applicable to diffraction based overlay measurements and pupil based overlay measurements.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further embodiments according to the invention are provided in below numbered clauses:

1. A method of measuring a parameter of a lithographic process, the method comprising the steps of:
obtaining a plurality of first measurements, said first measurements comprising measurements of structural asymmetry relating to a plurality of first structures, said plurality of first measurements comprising measurements corresponding to different measurement combinations, differing in terms of at least measurement radiation;
obtaining a plurality of second measurements, said second measurements comprising measurements of target asymmetry relating to a plurality of targets, each of said plurality of second measurements corresponding to one of said plurality of first measurements in terms of the measurement combination, each of said targets comprising one of said first structures and a second structure overlaid thereon, said target asymmetry comprising an overlay contribution which is independent of structural asymmetry, and a structural contribution due to structural asymmetry in at least said first structure;
determining a relationship function describing the relationship between said first measurements and said second measurements, for each of said measurement combinations;
determining, from said relationship function, a corrected overlay value, said corrected overlay value being corrected for said structural contribution due to structural asymmetry in at least said first structure.

2. A method according to clause 1 wherein said measurement combinations additionally differ in terms of a value for at least a first parameter.

3. A method according to clause 2 wherein said at least one first parameter relates to position on a surface of a substrate.

4. A method according to clause 2 or 3 wherein said method comprises determining simultaneous equations relating corresponding pairs of said first measurements and said second measurements in terms of a corresponding relationship function; and solving said simultaneous equations to obtain solutions for said relationship function, each solution for said relationship function corresponding to a particular measurement radiation.

5. A method according to clause 4 wherein each of said simultaneous equations additionally relate corresponding pairs of said first measurements and said second measurements in terms of said overlay contribution which is independent of structural asymmetry.

6. A method according to clause 5 wherein solving said simultaneous equations comprises obtaining values for said overlay contribution which are independent of structural asymmetry.

7. A method according to any of clauses 4 to 6 wherein said measurement combinations are of sufficient number such that the number of simultaneous equations is greater than the number of unknowns being solved for, said unknowns including solutions for said relationship function.

8. A method according to any of clauses 4 to 7 wherein relationship function is a linear function of parameters and said simultaneous equations are solved via a matrix method.

9. A method according to clause 8 wherein said matrix method comprises constructing a first matrix of the second measurements, constructing a matrix coefficient comprising said first measurements, and solving for a matrix of unknowns comprising a relationship function for each simultaneous equation.

10. A method according to clause 9 wherein the matrix of unknowns comprises a parameter relating to the overlay contribution which is independent of structural asymmetry, said parameter relating to the overlay contribution which is independent of structural asymmetry being and independent of said measurement radiation and dependent upon said at least the first parameter.

11. A method according to clause 9 or 10 wherein the rank of the matrix coefficient is larger than the number of unknowns being solved for.

12. A method according to any preceding clause wherein a corrected overlay value is obtained for each of said measurement combinations.

13. A method according to any preceding clause comprising determining preferred measurement radiations, said method further comprising:
determining a set of corrected overlay values for each measurement radiation used to obtain said first measurements and second measurements;
determining a set of measurement recipe independent overlay values describing the overlay contribution independent of structural asymmetry;
determining a plurality of difference metrics, each difference metric relating to a different subset of said measurement radiations, said difference metric describing a difference in the overlay values for corresponding overlay values of the set of measurement recipe independent overlay values and different pairs of the sets of corrected overlay values comprised within that subset of said measurement radiations.

14. A method according to clause 13 wherein corresponding overlay values comprise overlay values corresponding to the same location on a substrate.

15. A method according to clause 13 or 14 wherein each of said different subsets of measurement radiations comprise all of said measurement radiations used to obtain said first and second measurements less one, such that a different measurement radiation is omitted from each of said subsets and that a difference metric is determined for every combination of said measurement radiations less one.

16. A method according to clause 15 wherein said method comprises identifying as the worst performing measurement radiation, the measurement radiation not comprised within the subset of measurement radiations for which the corresponding difference metric indicates the smallest differences between corresponding overlay values.

17. A method according to clause 16 wherein said steps of determining a plurality of difference metrics and identifying the worst performing measurement radiation is repeated iteratively, each iteration comprising determining a plurality of difference metrics and identifying the worst performing measurement radiation for the remaining measurement radiations less the measurement radiations which have been identified as the worst performing measurement radiations in previous iterations.

18. A method according to clause 17 wherein the iterations are repeated until only two measurement radiations remain.

19. A method according to clause 17 or 18 wherein a difference threshold is determined, said difference threshold indicating a threshold value for the difference metric, said preferred measurement radiations being the subset of measurement radiations having the maximum number of measurement radiations out of the subsets for which the corresponding difference metric meets said difference threshold.

20. A method according to any of clauses 16 to 19 wherein said measurement radiations are ranked according to the order in which they are identified as the worst performing measurement radiation.

21. A method according to clause 1 wherein said relationship function comprises a constant, and said first measurements and said second measurements each comprise measurements performed with measurement combinations comprising different pairs of measurement radiations; and said relationship function describes the relationship between said first measurements as performed with one of said pair of measurement radiations and the difference of said second measurements as performed with a first one of said pair of measurement radiations and a second one of said pair of measurement radiations.

22. A method according to clause 21 wherein said step of determining at least one relationship function comprises making a 3-dimensional plot of said first measurements as performed with a first one of said pair of measurement radiations against said first measurements as performed with a second one of said pair of measurement radiations against a difference of said second measurements as performed with the first one of said pair of measurement radiations and the second one of said pair of measurement radiations.

23. A method according to clause 22 wherein data points on said 3-dimensional plot substantially correlate to define a flat plane and wherein a first relationship function is described by the slope of said plane relative to an axis of said first measurements as performed with the first one of said pair of measurement radiations and a second relationship function is described by the slope of said plane relative to an axis of said as performed with the second one of said pair of measurement radiations.

24. A method according to clause 21 wherein said step of determining a relationship function comprises determining a relationship function which describes a substantially linear relationship between:

a first difference, comprising the difference of said first measurements as performed with a first one of said pair of measurement radiations and said first measurements as performed with a second one of said pair of measurement radiations; and a second difference, comprising the difference of said second measurements as performed with the first one of said pair of measurement radiations and the second one of said pair of measurement radiations.

25. A method according to clause 24 wherein said step of determining at least one relationship function comprises making a plot of the first difference against the second difference, said relationship function being described by the slope of a line fitted to said plot.

26 A method according to any of any of clauses 21 to 25 comprising the step of determining the degree of correlation of at least 1) said first measurements as performed with the first and/or the second of said pair of measurement radiations and 2) the difference of said second measurements as performed with the first one of said pair of measurement radiations and the second one of said pair of measurement radiations.

27. A method according to clause 26 comprising an initial optimization to determine a preferred target from a plurality of candidate targets, said initial optimization comprising:

obtaining plural sets of measurements comprising said first measurements and said second measurements, for multiple samples of a plurality of candidate targets and a plurality of candidate pairs of measurement radiation, each set of measurements relating to a different combination of one of said candidate targets and one of said pairs of candidate measurement radiations;

determining said degree of correlation for each of said plural sets of measurements; and selecting a preferred target from one of said candidate targets based upon the determined degree of correlation for each set of measurements.

28. A method according to clause 27 wherein said step of selecting a preferred target comprises selecting a preferred combination of one of said candidate targets and one of said pairs of candidate measurement radiations based upon the determined degree of correlation for each set of measurements.

29. A method according to clause 28 comprising selecting as the preferred combination from said subset of combinations, a combination for which the corresponding set of measurements best defines a flat plane on a corresponding plot of said first measurements as performed with a first one of said pair of measurement radiations against said first measurements as performed with a second one of said pair of measurement radiations against the difference of said second measurements as performed with the first one of said pair of measurement radiations and a second one of said pair of measurement radiations.

30. A method according to clause 29 wherein, where there is more than one combination for which the corresponding set of measurements defines a flat plane on said plot to an acceptable degree, said method further comprises:

determining the degree of uncertainty for each of these set of measurements which define a flat plane; and selecting as the preferred combination, the combination for which the corresponding set of measurements has the smallest determined degree of uncertainty.

31. A method according to any of clauses 1 to 20 comprising an initial optimization to determine a preferred target from a plurality of candidate targets, said initial optimization comprising:

obtaining plural sets of first measurements and second measurements, for multiple samples of a plurality of candidate targets and a plurality of candidate combinations of measurement radiations, each set of measurements relating to a different combination of one of said candidate targets and one of said combinations of candidate measurement radiations;

determining a degree of correlation between said first measurement and said second measurements for each of said plural sets of measurements; and selecting a preferred target from one of said candidate targets based upon the determined degree of correlation for each set of measurements.

32. A method according to clause 31 wherein said step of selecting a preferred target comprises selecting a preferred combination of one of said candidate targets and one of said combinations of candidate measurement radiations based upon the determined degree of correlation for each set of measurements.

33. A method according to any preceding clause wherein said overlay contribution which is independent of structural asymmetry comprises a contribution due to a known imposed bias and a contribution due to an overlay error.

34. A method according to any preceding clause wherein different measurement radiations comprise different wavelength and/or polarization.

35. A method according to any preceding clause comprising:

measuring said first structures to obtain said first measurements; and measuring said targets to obtain said second measurements.

36. A method according to clause 35 wherein said measuring of said first structure and/or target comprises:

illuminating the first structure or targets with said measurement radiation and detecting the measurement radiation scattered by each first structure or target; and measuring intensity asymmetry in corresponding higher orders of the scattered measurement radiation.

37. A method according to clause 36 wherein said step of determining the overlay contribution of the target asymmetry, comprises assuming that there is a non-linear periodic relationship between intensity asymmetry and the overlay contribution of the target asymmetry, said non-linear periodic relationship including an intensity offset term and a phase offset term, each offset term related to the structural asymmetry in at least the first structure.

38. A method according to clause 35, 36 or 37 wherein said measuring of the first structures is performed prior to the formation of the second structure.

39. A method according to clause 35, 36 or 37 wherein measuring of the first structures and said targets is performed using a single measurement on neighboring structures comprising a first structure prior to formation of a second structure, and a target subsequent to formation of a second structure.

40. A method according to any preceding clause comprising providing said plurality of first structures on a substrate; and providing said plurality of second structures on the substrate, wherein said second structures are overlaid onto said first structures, thereby forming said plurality of targets.

41. A method according to any preceding clause wherein at least said steps of obtaining a plurality of first measurements, obtaining a plurality of second measurements and determining a relationship function are all performed in a calibration routine to determine said relationship function for subsequent substrates; and wherein said method further comprises determining an updated value for the relationship function from a production substrate during a production process.

42. A method of selecting a target from a plurality of candidate targets said method comprising:

obtaining plural sets of measurements for a plurality of candidate measurement radiation combinations and a plurality of candidate targets, each candidate target comprising a first structure overlaid with a second structure, each set of measurements relating to a different combination of one of said candidate targets and one of said candidate measurement radiation combinations; each set of measurements comprising, for multiple samples of the candidate target:

plural first measurements comprising measurements of structural asymmetry in the first structure of the candidate target using, respectively, each measurement radiation of said candidate measurement radiation combination;

plural second measurements comprising measurements of target asymmetry in the candidate target using, respectively, each measurement radiation of said candidate measurement radiation combination;

for each set of measurements, determining a degree of correlation between said first measurements and said second measurements;

selecting a preferred target from one of said candidate targets based upon the determined degree of correlation for each set of measurements.

43. A method according to clause 42 wherein said step of selecting a preferred target comprises selecting a preferred combination of one of said candidate targets and one of said candidate measurement radiation combinations based upon the determined degree of correlation for each set of measurements.

44. A method according to clause 43 wherein said candidate measurement radiation combinations comprise candidate measurement radiation pairs and said method comprising selecting as the preferred combination from said subset of combinations, a combination for which a corresponding set of measurements best defines a flat plane on a corresponding plot of said first measurements as performed with a first one of said candidate measurement radiation pairs against said first measurements as performed with a second one of said candidate measurement radiation pairs against the difference of said second measurements as performed with the first one of said candidate measurement radiation pairs and a second one of said candidate measurement radiation pairs.

45. A method according to clause 44 wherein, where there is more than one combination for which the corresponding set of measurements best defines a flat plane on said plot to an acceptable degree, said method further comprises:

determining the degree of uncertainty for each of these set of measurements which define a flat plane; and selecting as the preferred combination, the combination for which the corresponding set of measurements has the smallest determined degree of uncertainty.

46. A method according to any of clauses 43 to 45 comprising the step of selecting one of measurement radiations of the measurement radiation combination of said preferred combination of one of said candidate targets and one of said candidate measurement radiation combinations as a preferred measurement radiation based on which of these results in the smallest value for measurement of structural asymmetry.

47. A method according to clause 46 comprising performing an overlay measurement using said preferred measurement radiation on the preferred target of the preferred combination.

48. A method according to any of clauses 43 to 46 comprising performing an overlay measurement using the measurement radiation combination of said preferred combination on the preferred target of the preferred combination.

49. A metrology apparatus for measuring a parameter of a lithographic process, the metrology apparatus being operable to perform the method of any of clauses 1 to 48.

50. A metrology apparatus according to clause 49 comprising:
a support for said substrate having a plurality of targets thereon;
an optical system for measuring each target; and
a processor arranged to perform said step of determining the overlay contribution of the target asymmetry of each target.

51. A lithographic system comprising:
a lithographic apparatus comprising:
an illumination optical system arranged to illuminate a pattern;
a projection optical system arranged to project an image of the pattern onto a substrate; and
a metrology apparatus according to any clause 49 or 50,
wherein the lithographic apparatus is arranged to use the determined overlay contribution calculated by the metrology apparatus in applying the pattern to further substrates.

52. A computer program comprising processor readable instructions which, when run on suitable processor controlled apparatus, cause the processor controlled apparatus to perform the method of any one of clauses 1 to 48.

53. A computer program carrier comprising the computer program of clause 52.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of measuring a parameter of a lithographic process, the method comprising:
obtaining a plurality of first measurements, wherein the plurality of first measurements comprise measurements of structural asymmetry of a plurality of first structures, and the plurality of first measurements are obtained using a plurality of measurement radiations;
obtaining a plurality of second measurements, wherein:
the plurality of second measurements comprise measurements of a target asymmetry of a plurality of targets,
each of the plurality of second measurements corresponds to one of the plurality of first measurements,
each of the plurality of targets comprises one of the plurality of first structures and a second structure overlaid thereon, and
the measurements of the target asymmetry comprise an overlay contribution which is independent of structural asymmetry and a structural contribution that is due to structural asymmetry;
determining, using a processor, a relationship function describing a relationship between the plurality of first measurements and the plurality of second measurements; and
determining, using the processor, a corrected overlay value from the relationship function, the corrected overlay value being corrected for the structural contribution due to structural asymmetry,
wherein the overlay contribution which is independent of structural asymmetry comprises a contribution due to a known imposed bias and a contribution due to an overlay error.

2. A method of measuring a parameter of a lithographic process, the method comprising:
obtaining a plurality of first measurements, wherein the plurality of first measurements comprise measurements of structural asymmetry of a plurality of first structures, and the plurality of first measurements are obtained using a plurality of measurement radiations;
obtaining a plurality of second measurements, wherein:
the plurality of second measurements comprise measurements of a target asymmetry of a plurality of targets,
each of the plurality of second measurements corresponds to one of the plurality of first measurements,
each of the plurality of targets comprises one of the plurality of first structures and a second structure overlaid thereon, and
the measurements of the target asymmetry comprise an overlay contribution which is independent of structural asymmetry and a structural contribution that is due to structural asymmetry;
determining, using a processor, a relationship function describing a relationship between the plurality of first measurements and the plurality of second measurements; and
determining, using the processor, a corrected overlay value from the relationship function, the corrected overlay value being corrected for the structural contribution due to structural asymmetry,
wherein the plurality of measurement radiations comprises at least one of different wavelengths or different polarizations.

3. The method of claim 2, comprising:
measuring the plurality of first structures to obtain the plurality of first measurements; and measuring the plurality of targets to obtain the plurality of second measurements.

4. The method of claim 3, wherein the measuring of the plurality of first structures or the plurality of targets comprises:
- illuminating the first structures or targets with the measurement radiation;
- selecting the measurement radiation scattered by each first structure or target; and
- measuring intensity asymmetry in corresponding higher orders of the scattered measurement radiation.

5. The method of claim 4, further comprising:
- determining the overlay contribution of the target asymmetry by assuming a non-linear periodic relationship between intensity asymmetry and the overlay contribution of the target asymmetry, the non-linear periodic relationship including an intensity offset term and a phase offset term, each offset term related to the structural asymmetry.

6. The method of claim 3, wherein the measuring of the plurality of first structures is performed prior to formation of the second structure.

7. The method of claim 3, wherein the measuring of the plurality of first structures and the plurality of targets is performed using a single measurement on neighboring structures comprising a first structure prior to formation of a second structure and a target subsequent to formation of a second structure.

8. A method of measuring a parameter of a lithographic process, the method comprising:
- obtaining a plurality of first measurements, wherein the plurality of first measurements comprise measurements of structural asymmetry of a plurality of first structures, and the plurality of first measurements are obtained using a plurality of measurement radiations;
- obtaining a plurality of second measurements, wherein:
  - the plurality of second measurements comprise measurements of a target asymmetry of a plurality of targets,
  - each of the plurality of second measurements corresponds to one of the plurality of first measurements,
  - each of the plurality of targets comprises one of the plurality of first structures and one of a plurality of second structures overlaid thereon, and
  - the measurements of the target asymmetry comprise an overlay contribution which is independent of structural asymmetry and a structural contribution that is due to structural asymmetry;
- determining, using a processor, a relationship function describing a relationship between the plurality of first measurements and the plurality of second measurements; and
- determining, using the processor, a corrected overlay value from the relationship function, the corrected overlay value being corrected for the structural contribution due to structural asymmetry,
- wherein the plurality of first structures and the plurality of second structures are on a substrate, and the plurality of second structures are overlaid onto the plurality of first structures, thereby forming the plurality of targets.

\* \* \* \* \*